(12) United States Patent
Monahan et al.

(10) Patent No.: US 10,020,200 B1
(45) Date of Patent: Jul. 10, 2018

(54) PATTERNED ATOMIC LAYER ETCHING AND DEPOSITION USING MINIATURE-COLUMN CHARGED PARTICLE BEAM ARRAYS

(71) Applicant: Multibeam Corporation, Santa Clara, CA (US)

(72) Inventors: Kevin M. Monahan, Cupertino, CA (US); Theodore A. Prescop, San Jose, CA (US); Michael C. Smayling, Fremont, CA (US); David K. Lam, Saratoga, CA (US)

( * ) Notice: Subject to any disclaimer, the term of this patent is extended or adjusted under 35 U.S.C. 154(b) by 0 days.

(21) Appl. No.: 14/966,165

(22) Filed: Dec. 11, 2015

Related U.S. Application Data

(60) Provisional application No. 62/107,332, filed on Jan. 23, 2015, provisional application No. 62/115,626, (Continued)

(51) Int. Cl.
 *H01L 21/3065* (2006.01)
 *H01L 21/02* (2006.01)
 (Continued)

(52) U.S. Cl.
 CPC ...... *H01L 21/3065* (2013.01); *H01L 21/0228* (2013.01); *H01L 21/0262* (2013.01);
 (Continued)

(58) Field of Classification Search
 CPC ...... C23C 16/486; C23C 16/487; H01J 37/06; H01J 37/08; H01J 37/244; H01J 37/30;
 (Continued)

(56) References Cited

U.S. PATENT DOCUMENTS

| | | | | |
|---|---|---|---|---|
| 4,756,794 A | * | 7/1988 | Yoder | H01L 21/465 156/345.24 |
| 5,599,749 A | * | 2/1997 | Hattori | H01J 9/025 216/11 |

(Continued)

OTHER PUBLICATIONS

T. Faraz, "Atomic Layer Etching: What can we learn from Atomic Layer Deposition?", ECS J. Solid State Sci. Technol. 4(6) (2015), N5023-N5032.

(Continued)

*Primary Examiner* — Dale E Page
*Assistant Examiner* — Quovaunda V Jefferson
(74) *Attorney, Agent, or Firm* — Carrington, Coleman, Sloman & Blumenthal, L.L.P.; Seth A. Horwitz

(57) ABSTRACT

Methods and systems for direct atomic layer etching and deposition on or in a substrate using charged particle beams. Electrostatically-deflected charged particle beam columns can be targeted in direct dependence on the design layout database to perform atomic layer etch and atomic layer deposition, expressing pattern with selected 3D-structure. Reducing the number of process steps in patterned atomic layer etch and deposition reduces manufacturing cycle time and increases yield by lowering the probability of defect introduction. Local gas and photon injectors and detectors are local to corresponding columns, and support superior, highly-configurable process execution and control.

15 Claims, 23 Drawing Sheets

Related U.S. Application Data filed on Feb. 12, 2015, provisional application No. 62/151,225, filed on Apr. 22, 2015.

(51) Int. Cl.
  *H01L 21/308* (2006.01)
  *H01L 21/66* (2006.01)

(52) U.S. Cl.
  CPC .......... *H01L 21/3085* (2013.01); *H01L 22/12* (2013.01); *H01L 22/20* (2013.01)

(58) Field of Classification Search
  CPC ............. H01L 21/3065; H01L 21/0262; H01L 21/3085; H01L 21/0228; H01L 22/12; H01L 22/02
  See application file for complete search history.

(56) References Cited

U.S. PATENT DOCUMENTS

| | | | |
|---|---|---|---|
| 5,892,224 A * | 4/1999 | Nakasuji | G01N 23/225 250/307 |
| 6,355,994 B1 | 3/2002 | Andeen | |
| 6,437,352 B1 * | 8/2002 | Gordon | B82Y 10/00 250/398 |
| 6,617,587 B2 | 9/2003 | Parker | |
| 6,734,428 B2 | 5/2004 | Parker | |
| 6,738,506 B2 | 5/2004 | Miller | |
| 6,777,675 B2 | 8/2004 | Parker | |
| 6,844,550 B1 | 1/2005 | Yin | |
| 6,872,958 B2 | 3/2005 | Andeen | |
| 6,943,351 B2 | 9/2005 | Parker | |
| 6,977,375 B2 | 12/2005 | Yin | |
| 7,122,795 B2 | 10/2006 | Parker | |
| 7,227,142 B2 | 6/2007 | Parker | |
| 7,238,294 B2 | 7/2007 | Koops | |
| 7,378,003 B2 | 5/2008 | Athas | |
| 7,435,956 B2 | 10/2008 | Parker | |
| 7,456,402 B2 | 11/2008 | Parker | |
| 7,462,848 B2 | 12/2008 | Parker | |
| 7,786,454 B2 | 8/2010 | Parker | |
| 7,928,404 B2 | 4/2011 | Parker | |
| 7,941,237 B2 | 5/2011 | Parker | |
| 8,242,457 B2 | 8/2012 | Parker | |
| 8,384,048 B2 | 2/2013 | Wiesner | |
| 8,999,627 B1 | 4/2015 | Lam | |
| 8,999,628 B1 | 4/2015 | Lam | |
| 9,184,027 B1 | 11/2015 | Lam | |
| 9,207,539 B1 | 12/2015 | Lam | |
| 9,453,281 B1 | 9/2016 | Prescop | |
| 9,466,463 B1 | 10/2016 | Lam | |
| 9,466,464 B1 | 10/2016 | Lam | |
| 9,478,395 B1 | 10/2016 | Monahan | |
| 9,556,521 B1 | 1/2017 | Prescop | |
| 9,595,419 B1 | 3/2017 | Monahan | |
| 9,620,332 B1 | 4/2017 | Lam | |
| 9,673,114 B1 | 6/2017 | Lam | |
| 2002/0009208 A1 * | 1/2002 | Alattar | G06F 17/30876 382/100 |
| 2002/0028396 A1 * | 3/2002 | Surendra | G03F 1/22 430/5 |
| 2003/0097988 A1 * | 5/2003 | Schaepkens | C23C 16/4558 118/723 MP |
| 2003/0122087 A1 * | 7/2003 | Muraki | B82Y 10/00 250/492.2 |
| 2004/0033679 A1 * | 2/2004 | Jacobson | B82Y 10/00 438/510 |

OTHER PUBLICATIONS

Riika Puurunen, "Surface chemistry of atomic layer deposition: a case study for the trimethylaluminum/water process", J. App. Phys. 97, 121301 (2005).

Steven M. George, "Atomic Layer Deposition: An Overview", Chem. Rev. (2010), 110(1), 111-31.

\* cited by examiner

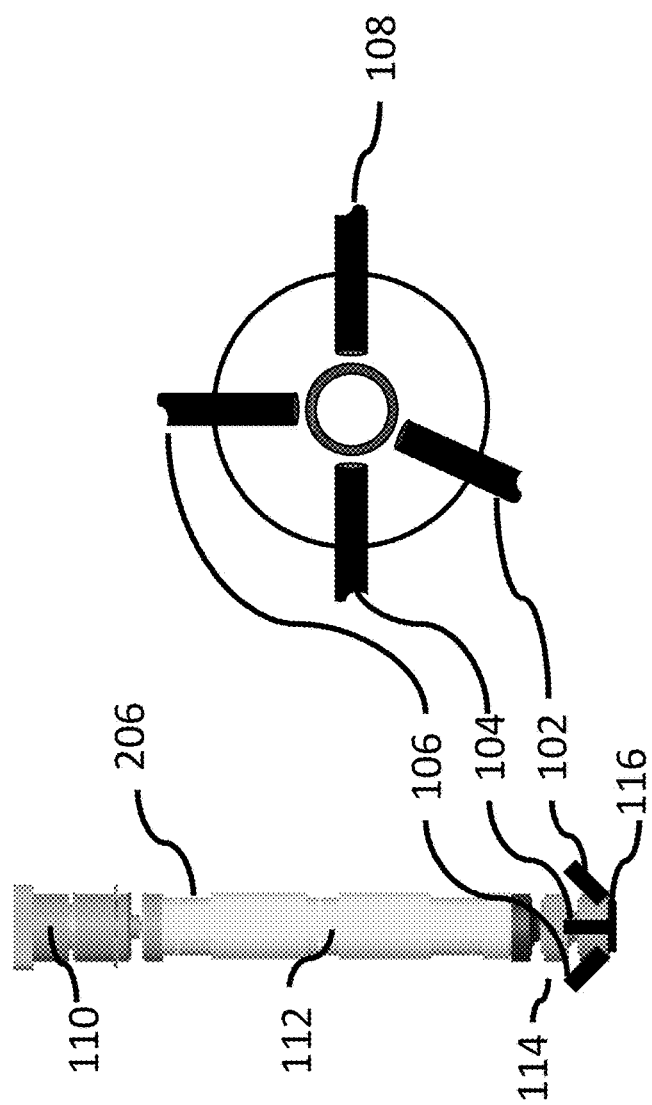

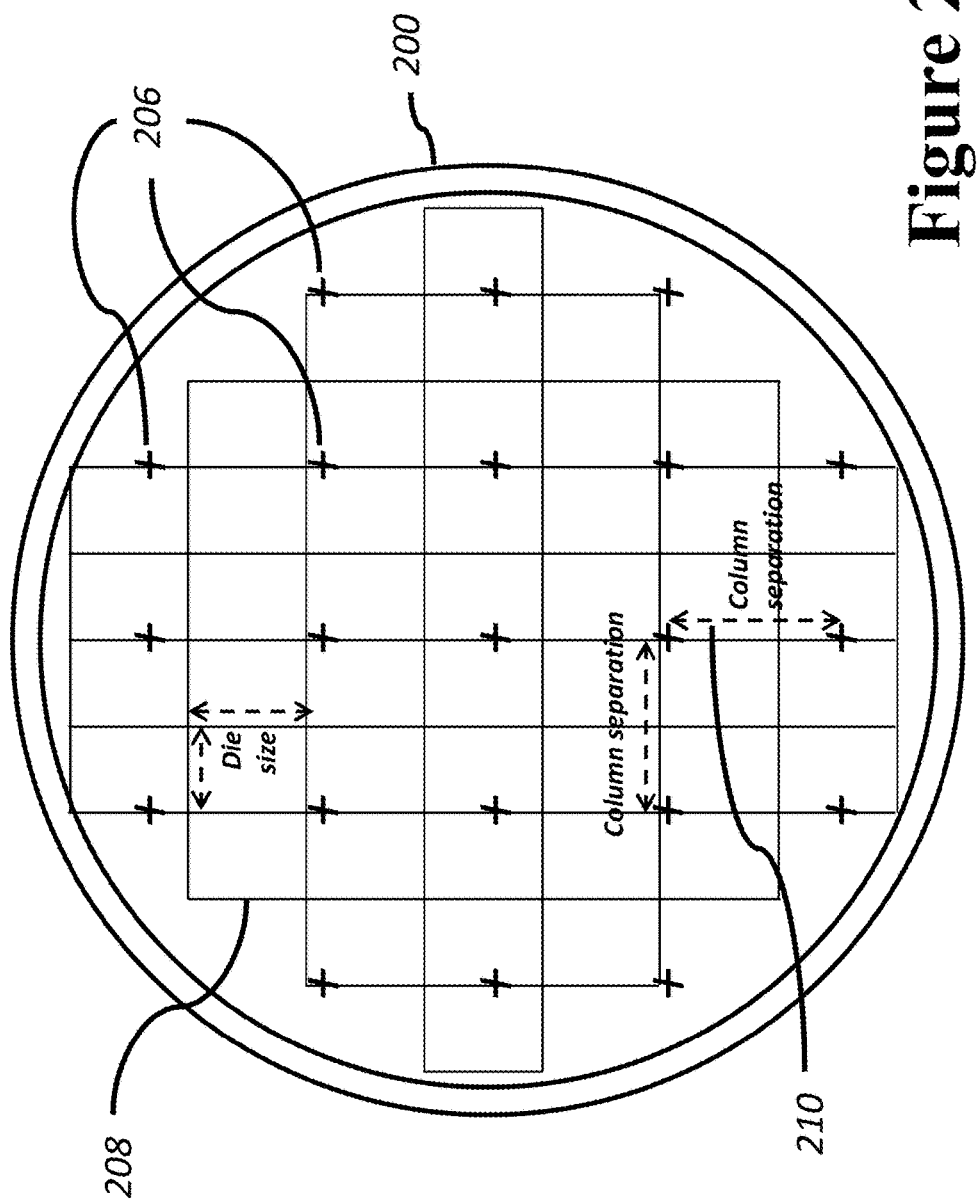

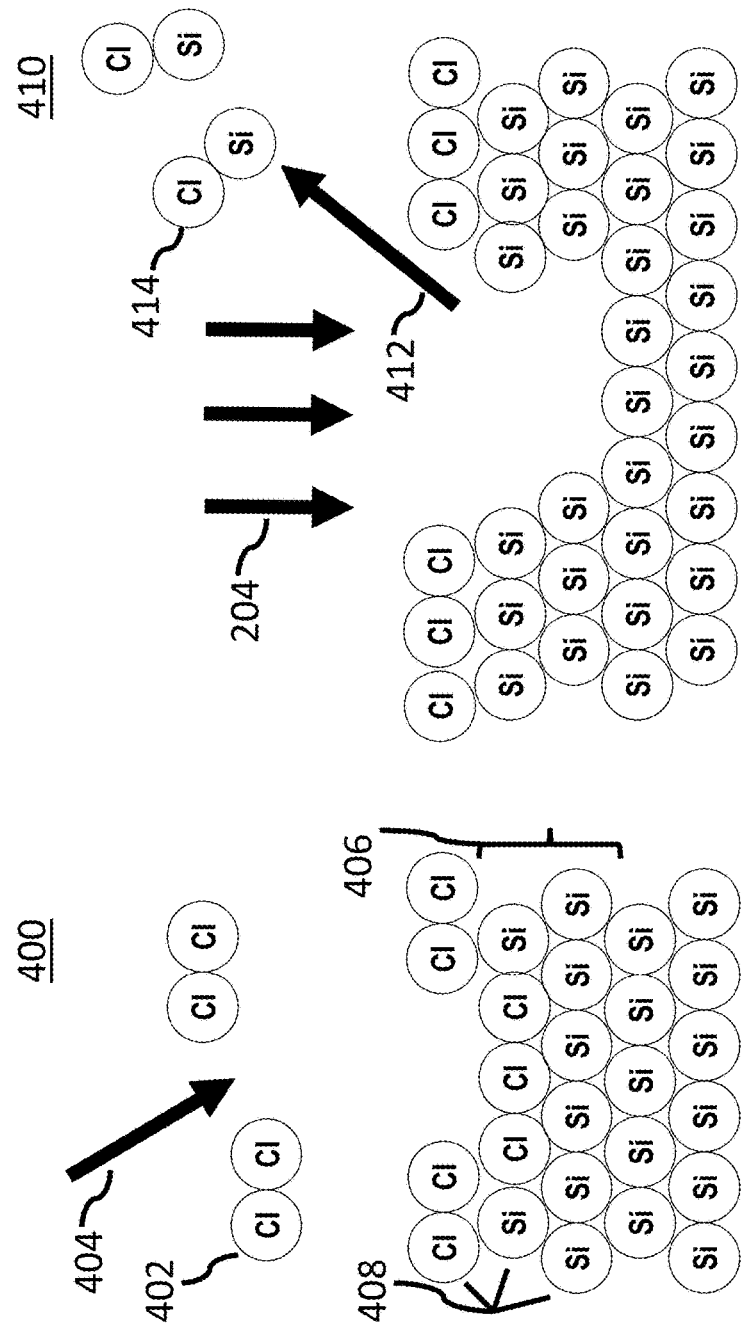

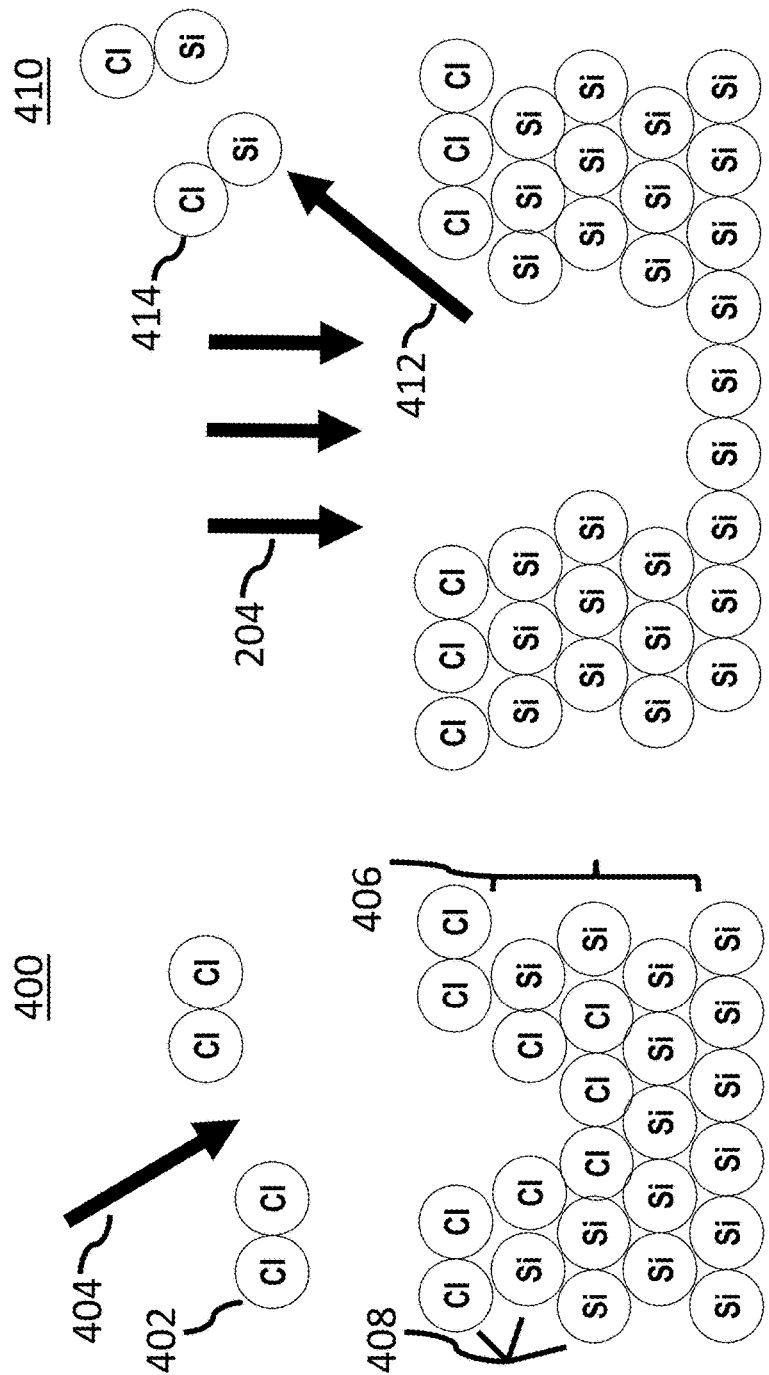

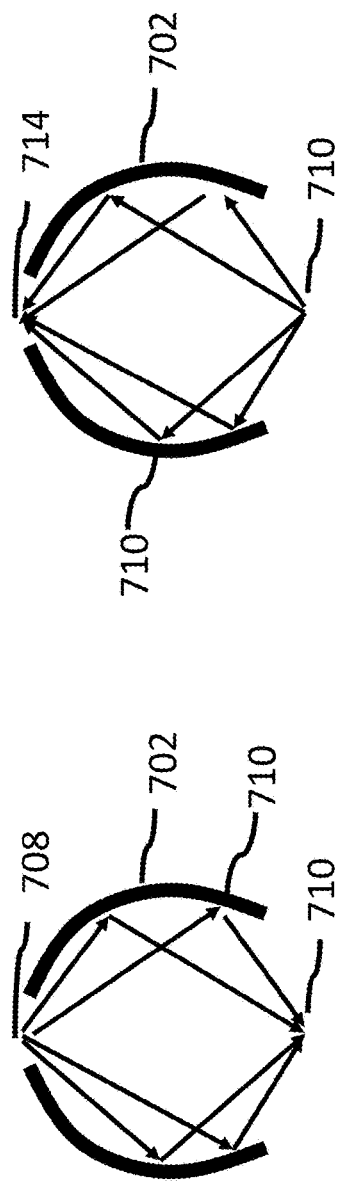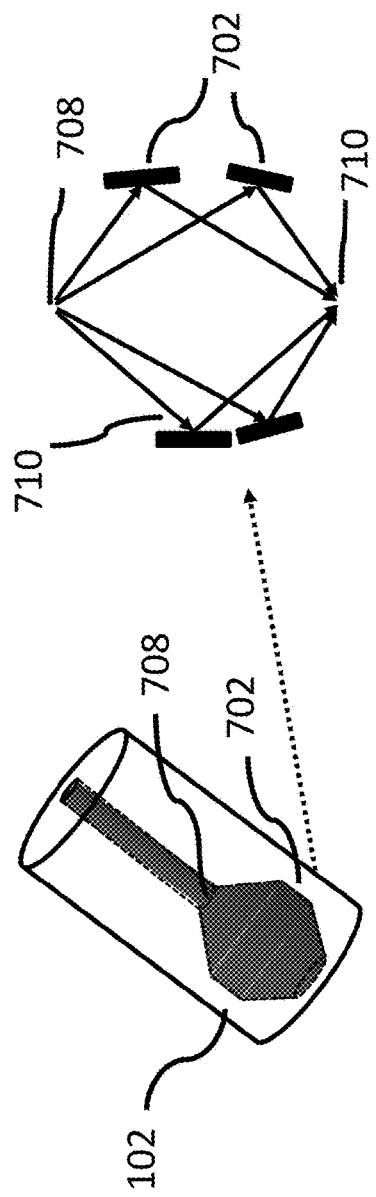

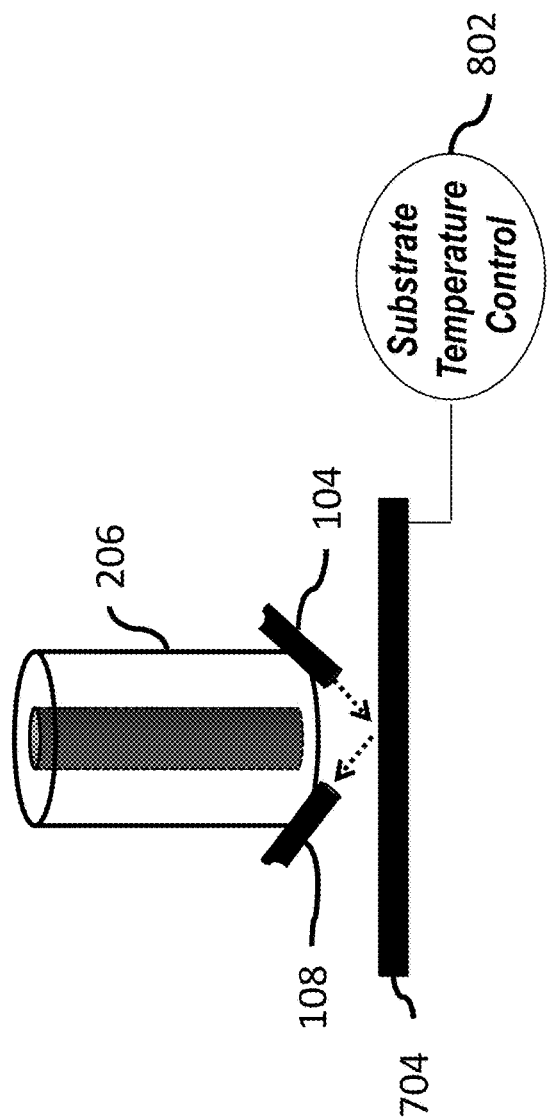

PATTERNED ATOMIC LAYER ETCHING AND DEPOSITION USING MINIATURE-COLUMN CHARGED PARTICLE BEAM ARRAYS

CROSS-REFERENCE

Priority is claimed from, and this application is a non-provisional of, Provisional Pat. App. No. 62/107,332, filed Jan. 23, 2015; Provisional Pat. App. No. 62/115,626, filed Feb. 12, 2015; and Provisional Pat. App. No. 62/151,225, filed Apr. 22, 2015, which are hereby incorporated by reference.

BACKGROUND

The present application relates to systems, devices and methods for patterned atomic layer etching and deposition of substrates using charged particle beams; and more particularly to atomic layer etching and deposition of substrates at precise locations as defined in a design layout database using multiple, matched charged particle beams, with the assistance of gas and/or photon injection, and/or of gas and/or photon process control, metrology and endpoint detection.

Note that the points discussed below may reflect the hindsight gained from the disclosed inventions, and are not necessarily admitted to be prior art.

FIG. 2A shows an example of a wafer 200 being scanned by multiple charged particle beams 204 emitted by respective miniature electrostatically-deflected beam columns 206. Individual columns 206 are able to target a portion 202 of the substrate surface 706 with their respectively emitted beams 204.

FIG. 2B shows an example of a wafer 200. Example die 208 size and column 206 center-to-center spacing 210 (column separation) are shown. A regular grid of columns 206 (columns 206 are shown via their center positions, represented here as plusses) can use different spacing 210 in different (generally, orthogonal) directions. Die 208 size and column separation 210 are not required to (and generally, will not) correspond. Column separation 210 generally corresponds to the "writing area" of corresponding columns 206. A column's 206 "writing area" is defined as the substrate area 202 targetable by a charged particle beam 204 emitted from the column 206, taking into account stage movement.

The multiple column 206 array comprises miniature (small enough to fit multiple columns in an array) charged particle beam columns 206 arranged in a regular grid. For example, column 206 arrays with center-to-center column spacing 210 of 30 mm×30 mm have been implemented, though other column spacings 210 (e.g., 24 mm×33 mm) can also be used.

A stripe is the portion of the wafer 200 surface that a charged particle beam can target while the stage is moving predominantly in a single direction, i.e., before the stage moves laterally and switches predominant directions to give the beam access to a different stripe. A "frame" is defined herein as the portion of the wafer surface that a beam can target at a given time, corresponding to the main-field deflection area at that time, as designated by the design layout database. A frame is typically designated to be rectangular, for convenience (e.g., to tile the writing area); and smaller than the furthest extent to which the beam can be deflected (e.g., to preserve beam targeting accuracy).

"1-D" refers to 1-D gridded design rule. In a 1-D layout, optical pattern design is restricted to lines running in a single direction, with features perpendicular to the 1-D optical design formed in a complementary lithography step known as "cutting". The complementary step can be performed using a charged particle beam lithography tool comprising an array of columns 206—for example, electrostatically-controlled miniature electron beam columns 206. A 1-D layout is separated in the design layout database into a "line pattern" and a "cut pattern". The design layout database contains the information needed by lithography tools to pattern one or more layers on a substrate 704. A line pattern generally comprises an array of unidirectional lines. Cut patterns generally comprise line-cuts and holes ("cut features").

Generally, line patterns are written by an optical lithography system, which can be followed by other process steps to increase the density of lines on the substrate 704. Cut patterns are written by a complementary (generally higher-resolution) process, such as electron beam lithography. Use of electron beam lithography for this complementary process is also called complementary e-beam lithography, or CEBL. The combination of the line-forming process followed by line-cuts written with CEBL to pattern a substrate layer is called complementary lithography.

Atomic layer etching ("ALE") is a technique for removing atomically-thin layers (in some versions of ALE, monatomically-thin layers) of material using one or more reactive gasses and sequential reaction steps that are self-limiting (i.e., the details of the process limit removal to a single atomically-thin layer at a time).

Atomic layer deposition ("ALD") is a technique for depositing atomically-thin (typically a few atoms, e.g., 2 or 3 atoms, thick) layers of material using reactive gasses (typically two different reactants A and B that react in an ABAB binary reaction sequence) as deposition precursors and sequential reaction steps that are self-limiting (i.e., the details of the process limit deposition to a single layer of adsorbed reactive gas particles at a time).

Generally, ALE and ALD reactive gasses are supplied by blanket sources, and reaction energy for the ALE removal step and an ALD deposition step are supplied by blanket sources such as plasmas or high temperatures, typically resulting in uniform (unpatterned) ALE or ALD across the entire substrate surface 706.

Purging of the reaction chamber is generally required between each injection of a reactive gas (typically once per layer-etch cycle and once per layer-deposition half-cycle) to prevent buildup of reactive gasses (which could otherwise result in unintended etching or deposition, non-conformal etching or deposition, defects, or other undesired effects), allowing repeated atomic layer etch or deposition until the desired amount of material is removed or added. Purge cycles typically take, for example, 15 seconds to one minute per layer.

FIG. 2C shows an example of a process for ALE of (or on) a substrate 704 using prior art techniques.

In the ALE process as shown in FIG. 2C that uses a patterned resist and hard mask with blanket etching to express a specified pattern on an underlying material (substrate or deposited material), a design layout database is used to designate where on a substrate material should be etched 212. One or more optical masks are fabricated based on the design layout database 214 using a mask making tool 216. Fabrication of an optical mask set (multiple masks) typically takes weeks and costs millions of dollars at advanced process nodes.

"Blanket" deposition and etch (or other process) generally refers to deposition and etch (or other process) on the entire surface 706 of the substrate 704.

"Resist" refers herein to a class of materials used in substrate lithography. When a resist is deposited on a substrate 704 and exposed to an energy source corresponding to the type of resist (e.g., photons for a photoresist) in a chosen pattern, its chemical properties change (e.g., causing cross-linking between or dissociation of resist molecules) such that when the resist is developed (in ways similar to developing a photographic film), a portion of the resist corresponding to a positive or negative image of the pattern (depending on the type of resist) will remain, allowing the pattern to be expressed in the material underlying the resist, e.g., using etch steps.

A hard mask layer is blanket deposited on the substrate surface 706 in step 218 by a deposition tool 220. A photoresist layer is then blanket deposited over the hard mask layer 222 by a resist deposition tool 224. The photoresist is then exposed using the optical mask(s) 226 by an optical lithography tool 228. The exposed (or unexposed) portion of the resist layer (as designated by the optical mask(s)) is removed 230 using a resist developing tool 232, and the resulting patterned resist layer can be inspected for defects and/or process control metrology (After Develop Inspection (ADI) and metrology) 234 by an inspection and/or metrology tool 236.

The hard mask layer is then blanket etched 238, through the pattern expressed in the resist layer by steps 226 and 230, using an etch tool 240 to express (substantially) the same pattern in the hard mask layer. The resist layer is then removed 242 by a resist removal tool 244, and blanket ALE is performed on the underlying material 246 using an ALE tool 248 to express (substantially) the same pattern in said underlying material. One of ordinary skill in the arts of ALE will understand that other and/or additional steps can be used in a conventional ALE process.

FIG. 2D shows an example of a process for ALD onto a substrate surface 706 using prior art techniques. In the ALD process as shown in FIG. 2D that uses a patterned resist and hard mask with blanket etching to express a specified pattern on an underlying, previously-ALD-deposited material, steps 212 and 214 (using the mask making tool 216) are first performed. Blanket ALD is then performed 250 using an ALD tool 252. Steps 222 through 234 (using corresponding tools 224 through 236) are then performed. The ALD-deposited material is then blanket etched 254 through the pattern expressed in the resist using an etch tool 240, and the resist is removed 242 using a resist removal tool 244.

$T_i$ represents the amount of time added by a corresponding process step. $Y_i$ represents the yield impact of a corresponding process step (one minus probability of introducing one or more yield-reducing defects). Where T is the total time taken by an ALE or ALD process, and Y is the expected yield following an ALE or ALD process:

$T = \Sum_{i=1}^{N} T_i$      Equation 1:

$Y = \Pi_{i=1}^{N} Y_i$      Equation 2:

Numerous steps in conventional semiconductor lithography ALE and ALD processes are expensive and time consuming, and potentially introduce defects into the desired pattern, lowering yield. Process-induced defects can be introduced by, for example, wafer handling, resist spin and heating, lithography, resist development, inspection and thermal processing.

SUMMARY

The present application discloses new approaches to systems, devices and methods for patterned ALE and ALD of material of or on a substrate using multiple miniature charged particle beam columns variously configurable to directly express atomically-precise pattern layers on or in such materials WITHOUT A RESIST LAYER.

In particular, the inventors have discovered that high-throughput, resistless direct ALE and ALD using charged particle beam columns is enabled by using local gas and/or photon injectors fixedly located with respect to corresponding ones of the columns, and proximate, oriented towards and having line of sight to corresponding ones of the frames.

The inventors have also discovered that local photon detectors and gas detectors, situated locally to and collecting data directly from beam target locations, can be used to monitor and provide feedback to control of charged particle beam columns performing ALE or ALD processes. Local gas detectors can use kinetic lenses to increase specificity and quantity of collected gasses.

Preferred embodiments of miniature column charged particle beam ALE and ALD include control and inspection processes that can work directly and automatically from the SAME design layout database. In some embodiments, these and other processes can be implemented together within a single modular tool, allowing direct ALE and ALD of entire layers without breaking vacuum.

Direct ALE and ALD processes can be used to supplement or replace conventional lithography processes to provide new design opportunities, eliminate numerous lithography steps, increase throughput and dramatically increase yield.

BRIEF DESCRIPTION OF THE DRAWINGS

The disclosed inventions will be described with reference to the accompanying drawings, which show important sample embodiments and which are incorporated in the specification hereof by reference, wherein:

FIG. 1 schematically shows an example of a charged particle beam column.

FIG. 2B shows an example of a wafer.

FIG. 4C shows an example process for atomic layer etching.

FIG. 4D shows an example process for atomic layer etching.

FIG. 4E shows an example process for atomic layer etching.

FIG. 4F shows an example process for atomic layer etching.

FIG. 7C schematically shows an example of a gas injector with a rotational ellipsoid kinetic lens.

FIG. 7D schematically shows an example of a gas injector with a rotational ellipsoid kinetic lens.

FIG. 7E schematically shows an example of a gas injector with a kinetic lens.

FIG. 8 schematically shows an example of a photon injector and a photon detector mounted on a charged particle beam column.

DETAILED DESCRIPTION OF SAMPLE EMBODIMENTS

Figure 2A:
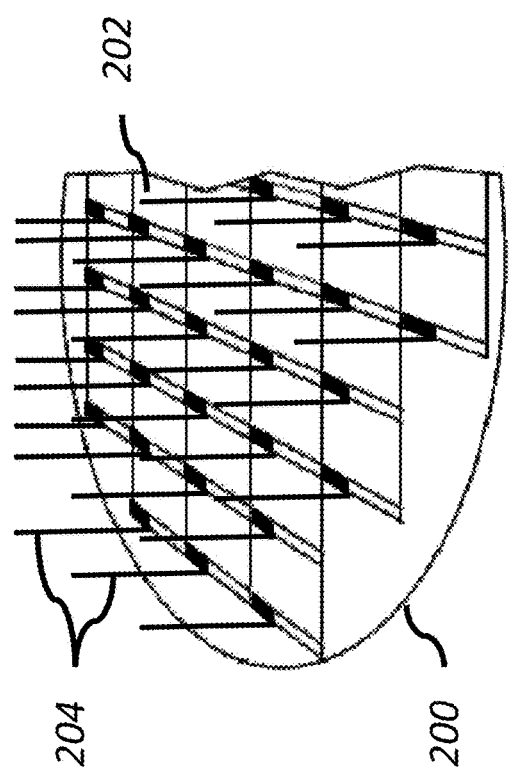
FIG. 2A shows an example of a wafer being scanned by multiple charged particle beams emitted by respective beam columns.

The numerous innovative teachings of the present application will be described with particular reference to presently preferred embodiments (by way of example, and not of limitation). The present application describes several inventions, and none of the statements below should be taken as limiting the claims generally.

The present application discloses new approaches to systems, devices and methods for patterned ALE and ALD of material of or on a substrate using multiple miniature charged particle beam columns variously configurable to directly express atomically-precise pattern layers on or in such materials WITHOUT A RESIST LAYER.

In particular, the inventors have discovered that high-throughput, resistless direct ALE and ALD using charged particle beam columns is enabled by using local gas and/or photon injectors fixedly located with respect to corresponding ones of the columns, and proximate, oriented towards and having line of sight to corresponding ones of the frames.

The inventors have also discovered that local photon detectors and gas detectors, situated locally to and collecting data directly from beam target locations, can be used to monitor and provide feedback to control of charged particle beam columns performing ALE or ALD processes. Local gas detectors can use kinetic lenses to increase specificity and quantity of collected gasses.

Preferred embodiments of miniature column charged particle beam ALE and ALD include control and inspection processes that can work directly and automatically from the SAME design layout database. In some embodiments, these and other processes can be implemented together within a single modular tool, allowing direct ALE and ALD of entire layers without breaking vacuum.

Direct ALE and ALD processes can be used to supplement or replace conventional lithography processes to provide new design opportunities, eliminate numerous lithography steps, increase throughput and dramatically increase yield.

The disclosed innovations, in various embodiments, provide one or more of at least the following advantages. However, not all of these advantages result from every one of the innovations disclosed, and this list of advantages does not limit the various claimed inventions.

Enable rapid patterned atomic layer etching of a material without resist, without hard mask, and without photomasks;
  enable rapid patterned atomic layer deposition on a substrate surface without resist, without hard mask, and without photomasks;
  enable TARGETED atomic layer etch directly from the design layout database;
  enable TARGETED atomic layer deposition directly from the design layout database;
  reduce purge time required for atomic layer deposition;
  reduce purge time required for atomic layer etch;
  improve yield;
  faster manufacture of semiconductor and other substrate devices;
  lower cost of manufacture of semiconductor and other substrate devices;
  faster design to manufacturing process;
  lower cost of design to manufacturing process;
  faster per-layer patterning cycle;
  lower cost of per-layer patterning cycle;
  lower aggregate tool cost to pattern a substrate layer;
  fewer tools required to pattern a substrate layer;
  enhance patterning tool configurability;
  decrease chemical usage of material in patterned ALE and ALD processes;
  decrease environmental impact of material in patterned ALE and ALD processes;
  enable patterning, pattern inspection, defect identification and pattern repair without breaking vacuum;

ALE and ALD are LOCALIZED to (and in some embodiments, by) material affected by charged particle beams; and fewer substrate transfers between process tools.

Some exemplary parameters will be given to illustrate the relations between these and other parameters. However it will be understood by a person of ordinary skill in the art that these values are merely illustrative, and will be modified by scaling of further device generations, and will be further modified to adapt to different materials or architectures if used.

"Substrate" 704 is defined herein as a workpiece having a composition and shape amenable to patterning and modification of one or more layers of material thereupon using techniques applicable to semiconductor device fabrication, such that functional devices can be produced therefrom.

As used herein, "writing" a substrate 704 refers to any process which expresses specified pattern in or on the substrate 704 (including material deposited on the substrate surface 706), expressed through any physical or chemical property of said substrate 704 or deposited material. With respect to charged particle beams 204 targeted in direct dependence on a design layout database, "writing" includes, for example, "material subtraction" as disclosed in U.S. patent application Ser. No. 14/694,710, "material addition" as disclosed in U.S. patent application Ser. No. 14/745,463, and "direct atomic layer etch" and "direct atomic layer deposition" as disclosed herein.

"Direct atomic layer etch" ("direct ALE") is defined herein as ALE of material comprising or on a substrate 704, using one or more electrostatically-deflected charged particle beams 204 targeted in direct dependence on a design layout database; said etching localized to material directly affected by said beams 204, and comprising at least some intended (not incidental) etching of material immediately following said direct affect by said beams 204.

"Direct atomic layer deposition" ("direct ALD") is defined herein as ALD onto a substrate surface 706 or onto material previously deposited onto a substrate surface 706, using one or more electrostatically-deflected charged particle beams 204 targeted in direct dependence on a design layout database; said deposition localized to substrate surface 706 locations where said beams 204 have directly affected deposit species by providing energy required for one or more ALD-process-critical reactions between said species; and comprising at least some intended (not incidental) deposition of material immediately following said direct affect by said beams 204.

The present application is directed to, for example, factory-integrated use of systems comprising multiple miniature charged particle beam columns 206 to create nanometer-scale patterns on semiconductor wafers 200 or other substrates 704. Arrays of heavily configurable, miniature, electrostatically-controlled columns 206 can be used to pattern wafers 200 and other substrates 704 directly, without masks, without resist, and without previous lithographic steps. Such systems can be used to achieve massively parallel substrate processing and to reduce substrate travel per layer (or other cycle measure) of processing.

Embodiments disclosed herein enable precision processing of materials and, in particular, direct atomic layer etching of and direct atomic layer deposition onto materials common in the processing of semiconductor wafers 200 and other electrically, magnetically, optically, mechanically, chemically, or biologically active substrates 704. Such substrates 704 can comprise, for example, workpieces used in fabrication and repair of light emitting diodes (LEDs), giant magnetic resonance (GMR) structures used in thin-film heads, opto-electronic devices (OEDs) used for switching, micro-electro-mechanical systems (MEMS) structures, photonic metamaterials, and patterned substrates 704 used for chemical analysis and genetic sequencing.

For example, direct ALE and ALD can be performed using one or more multi-column charged particle beam systems 1100. These processes can be used alone, or in concert with other substrate processing techniques. Direct ALE or ALD processes can be performed either sequentially or simultaneously by multiple columns 206 in an array 1102, and different columns 206 in an array 1102 can be configured and/or optimized to perform the same direct ALE or ALD (or other) process, or different direct ALE or ALD processes (or other processes, e.g., inspection and metrology).

Direct ALE or ALD can create a layer of pattern specified by the design layout database in its entirety or in a complementary fashion with other patterning processes. For example, direct ALE or ALD can be used to add to or subtract from structures produced by optical lithography (or by other substrate processing techniques); or to add new physical structures.

In preferred embodiments, the array 1102 of charged particle beam columns 206 is stationary, the stage holding the wafer 200 moves back and forth, and individual charged particle beam columns 206 move (deflect) the corresponding beam 204 across the wafer 200 to perform direct ALE or ALD.

Preferably, beam motion across the wafer 200 (or other substrate 704) comprises vector-raster scanning while writing on a substrate (e.g., vector scanning to a registration mark, raster scanning the registration mark, and then vector scanning to write each cut feature) or vector-raster scanning while imaging a substrate (e.g., vector scanning to a target feature or "care-area" containing a target feature, and raster scanning across the target feature). Preferably, each column 206 has its own local (short communication path) control computer. Vector-raster scanning, care-areas, and use of multiple control computers local to respective columns 206 are disclosed in U.S. patent application Ser. No. 14/085,768, which is incorporated herein by reference. (As will be apparent to one of ordinary skill in the arts of charged particle beam substrate processing, "care-areas" can be adapted for use as approximately minimally-sized regions containing target locations for irradiation for various purposes in addition to defect identification.) These control methodologies enable areas of interest to be irradiated, while efficiently avoiding areas where direct ALE or ALD (or other charged particle beam function) is not required.

Rapid pattern alignment and registration with superior accuracy (e.g., for minimizing pattern overlay error) can be achieved using imaging targets generated using Hadamard and/or Walsh functions as disclosed in, for example, U.S. patent application Ser. No. 14/522,563, which is incorporated herein by reference.

High beam current can be maintained by minimizing charged-particle crossovers in the columns 206, reducing current-limiting Coulomb effects.

The design layout database is preferably partitioned to designate which column 206 will perform the work for the corresponding substrate writing area. Preferably, writing areas have the same size as column-to-column spacing 210.

In preferred embodiments, different columns 206 can perform direct ALE and/or ALD (and/or other processes, such as imaging, depending on configuration) on a patterned or unpatterned substrate 704 differently and independently, with beam deflection parameters determining targeted beam landing position based directly (though generally not only; e.g., tool parameter settings are also typically used, and identified areas of interest can be considered, as mentioned above) on a previously-partitioned design layout database used by various column functions (e.g., both direct ALE or ALD and inspection functions). Use of multiple columns 206 to independently and simultaneously write and/or image a substrate 704, both based directly on the same previously-partitioned design layout database, is disclosed in, for example, U.S. Pat. No. 8,999,627, which is incorporated herein by reference.

As used herein, sets of multiple beam columns being "substantially the same" means that the sets of multiple beam columns comprise arrays of multiple miniature, electrostatically-driven columns with identical column-to-column spacing, and identical type of beam deflection (electrostatic) and of focus mechanisms.

For stages, "substantially the same" means identical or nearly identical with respect to substrate-stage alignment mechanisms, stage positioning mechanisms, stage position accuracy, and control electronics and software. "Nearly" identical means that the variations can include, for example, year-to-year improvements in design or manufacturing techniques, or incremental improvements or optimizations to a design, which can result in two stages being "substantially the same" but not identical. However, major changes in design approach will break substantial sameness.

As used herein, "matched" columns 206 means that columns 206 are "substantially the same", and stages are "substantially the same". Generally, different matched columns 206 are able to process corresponding different writing areas of a substrate 704 similarly (preferably, nearly identically); and different arrays of matched columns 206, irradiating different substrates 704 carried by different stages that are substantially the same, are able to process the different substrates 704 similarly (preferably, nearly identically). Embodiments disclosed herein preferably use matched columns 206.

Fully automated beam targeting based directly on a design layout database is preferred. Beam targeting "based directly on a design layout database" is defined to mean that during patterning, local column controllers automatically access portions of the design layout database relevant to corresponding writing areas and interpret the design layout database directly into beam column control instructions for immediate use specifying beam deflection, beam dwell timing, beam blanking timing, beam shape and/or beam landing energy.

Columns 206 can be configured such that different columns 206 use different physical and chemical processes for direct ALE or ALD.

Beam column parameters and other parameters can be independently and automatically optimized per-column based on automatically analyzed images taken of ALE and/or ALD results. Automatic image analysis and column parameter optimization are disclosed in, for example, U.S. Pat. No. 8,999,628, which is incorporated herein by reference.

One of ordinary skill in the arts of charged particle beam ALE and/or ALD will recognize that a wide variety of other control options are available per-column 206.

Preferably, photon injectors 104 and detectors 108, and gas injectors 102 and detectors 106, as described below are "miniature"; that is, they are small enough to position (preferably, fixedly) at or near the bottom of a column 206 (preferably, attach to the column 206 and/or thread through its casing) whichever of said injectors and detectors 102, 104, 106, 108 are required by the embodiment, such that the injector or detector 102, 104, 106, 108 (and particularly the corresponding emitter or collector portion thereof) is located to permit function as described herein.

FIG. 1 schematically shows an example of a charged particle beam column 206 configured for direct ALE or ALD. Preferably, an array 1102 of such columns 206 (which can be individually customized to the particular processes to be respectively executed) is used to perform direct ALE or ALD (as disclosed with respect to, e.g., FIGS. 3A, 3C through 6D, and 11).

As used herein with respect to a gas or photon injector or detector 102, 104, 106, 108, "local" (also "Local" and "LOCAL") is defined as: mounted in a fixed position with respect to a corresponding one of multiple columns 206, the active emitting or collecting component(s) of said injector or detector 102, 104, 106, 108 having line of sight to and oriented towards the main-field deflection area 710, said active component(s) at least partially contained within the perimeter of the column 206.

An active emitting or collecting component(s) is the optical lens, gas inflow or outflow opening, or kinetic lens 702 that for the respective local injector or detector 102, 104, 106, 108 last emits gas particles or photons towards, or first collects gas particles or photons from, the corresponding main-field deflection area 710. Preferably, said active component(s) is as close as practical to the center of the column's 206 primary axis and to the substrate surface 706 without impacting the substrate surface 706, and without compromising column function (e.g., electrical characteristics of the column 206) or the focus area of the active component(s). Greater proximity is preferred, for example, to preserve collimation or focus, and for gas and photon collection effectiveness, selectivity and efficiency.

Except where stated otherwise, gas and photon injectors 102, 104 and detectors 106, 108 described with respect to the various embodiments disclosed herein are local. Direct ALE and ALD using multiple miniature charged particle beam columns 206 are enabled by the use of LOCAL gas and/or photon injectors and/or detectors 102, 104, 106, 108 as disclosed herein.

Local gas injectors 102 and/or local photon injectors 104 can be used to greatly increase removal or deposition rates of direct ALE or ALD processes; in some embodiments, sufficiently to provide throughput compatible with in-line fabrication processes. Further, as discussed below with respect to, e.g., FIGS. 3A, 3B, 3C, 5A, 5B and 5C, preferred embodiments provide significant yield advantages.

Local photon detectors 108 enable real time process monitoring of spatially localized ALE and ALD processes: generally, localized per-column 206 to individual frames 710. Features can be modified to the correct geometries, e.g., neither shorter nor taller than desired.

FIG. 1 schematically shows an example of a charged particle beam column 206 configured for ALE and/or ALD, comprising: a charged particle beam gun 110 (an ion gun or electron beam gun, respectively), including a charged particle source (an ion or electron source, respectively), aperture and electrostatic lens; a deflection assembly 112 for blanking the charged particle beam 204, deflecting the charged particle beam trajectory, and/or modifying the charged particle beam shape (blanking, deflecting or reshaping the ion or electron beam 204, respectively); a main lens 114, for focusing the charged particle beam (ion or electron beam 204) or adjusting the beam size at the substrate plane; one or more local gas injectors 102, for increasing partial pressure of process-critical gasses (e.g., ALE or ALD process gasses), creating oxidizing or reducing environments, or for creating other or additional advantageous chemical environments within the main-field deflection area 710; one or more local photon injectors 104; a local gas detector 106; one or more local photon detectors 108; and an electron detector 116, e.g., to detect secondary electrons or ions, and/or backscattered electrons or ions for CD metrology or overlay and localized process monitoring.

Preferably, configuration of individual columns 206 (e.g., in an array 1102, whether and which of, e.g., local injectors and/or detectors 102, 104, 106, 108 are assembled onto individual columns 206 in the array 1102) can be altered based on the particular intended application.

A local gas injector 102 can be used to increase the partial pressure of process gasses within a main-field deflection area 710 significantly (e.g., by multiple orders of magnitude) relative to the average ambient pressure in the vacuum chamber, while having minimal effect on process gas concentration at other main-field deflection areas 710 (corresponding to other columns 206). A kinetic lens 702 (further described below with respect to, e.g., FIGS. 7A, 7B, 7C, 7D and 7E) connected to a local gas injector 102 to collimate or focus the gas injector's 102 output on an area of the substrate surface 706 containing the main-field deflection area 710 of a corresponding column 206 further significantly raises consistently achievable partial pressures (in some embodiments, by multiple orders of magnitude). These large increases in partial pressures of advantageous gasses in a main-field deflection area 710—and thus, at the corresponding charged particle beam impact location—can significantly raise the etching or deposition rate of the direct ALE or ALD process (in some embodiments, by multiple orders of magnitude).

Generally, gas flow rate can be calculated ahead of time and depends on several parameters, including the particular process to be used (and its required and/or desired chemistry), local temperature (which can be controlled to be substantially constant, within an acceptable range depending on the particular process), the design layout database, and charged particle beam current (which can be constant). If necessary, changes to gas flow parameters during a direct ALE or ALD process can be made based on feedback from local detectors.

In a preferred embodiment, gas flow rate is kept above a pre-determined threshold such that supply of ALE or ALD precursors is not limiting.

A local photon injector 104 is preferably a light source optically connected by an optical fiber to a lens.

Local photon injectors 104 emitting infrared (IR) photons can be used to precisely raise the temperature of the substrate 704 at the beam impact location to optimize temperature conditions for the corresponding direct ALE or ALD process without overheating the substrate 704 as a whole. This generally allows a higher temperature at the frame than would be desirable for the entire substrate 704, and allows IR photon flux to be maintained at levels that increase the rate of adsorption, but are below levels that induce spontaneous etching (in some embodiments, orders of magnitude greater IR photon flux than could desirably be obtained using blanket illumination).

Preferably, the lens focuses the IR photons on a minimal area containing the main-field deflection area 710. In some embodiments, temperature optimization can be used to increase substrate surface 706 material adsorption rate of process gasses (higher process-critical gas adsorption rate typically correlates to shorter cycle times for direct ALE and ALD processes). Using temperature measured within a known small area containing the beam impact location (e.g., a minimal area containing the main-field deflection area 710), preferably using a local photon detector 108, temperature at the beam impact location can be approximated. Generally, because direct ALE material removal rate and direct ALD material deposition rate are limited by substrate surface 706 adsorption rate of process-critical gasses, by optimizing said temperature conditions, the direct ALE and ALD process rates can be significantly increased.

Desired local temperatures for individual columns 206 can be determined prior to starting a direct ALE or ALD process, depending on, for example, the design layout database and characteristics of the particular process(es) to be used. Feedback from local temperature measurement can then be used to control brightness and other characteristics (e.g., pulse rate, pulse duration) of the photon injector 102 to precisely control the local temperature of the substrate 704.

Local photon injectors 104 can also be used to shine photons, with wavelength(s) appropriate to one or more substrate surface materials (or adsorbed process gasses), on the main-field deflection area 710 to modulate surface reaction rates; generally, direct ALE and ALD can be further accelerated by exciting substrate surface material (or adsorbed process gas) electrons to a higher energy state. UV photon energies can be matched to the bond energies of reactant species. For example, deep UV is characteristic for photochemistry of various materials. Local UV photon injectors can provide illumination intensity near a reaction site that is orders of magnitude greater than could be desirably obtained by blanket illumination of the vacuum chamber surrounding a column 206 array.

Local photon injectors 104 can also be used to shine photons on the substrate surface material to perform various analyses (process monitoring) of substrate surface material, e.g., polarimetry, reflectometry and/or interferometry. For example, the intensity of reflected injected photons depends on the depth of ALE-removed material or thickness of ALD-deposited material (or the geometry/profile of either). Preferably, a local photon detector 108 is arranged to collect as many of the reflected photons as possible to optimize the efficacy of such analyses, as shown in FIG. 8. Such photons can generally be of any wavelength, within limits set by available optics and other physical properties.

Endpoint detection refers herein to using detectors to determine when a direct ALE or ALD process has been completed for a particular frame 710. As an ongoing direct ALE or ALD process etches or deposits material in or on the substrate 704, the properties of the etched or deposited material increasingly influences measurements of substrate surface 706 properties. Substrate surface material properties (e.g., reflectometry results), and rates of change and higher-order derivatives of indicated properties, can be used to accurately determine and/or predict process endpoints.

Process monitoring refers herein to analysis of detected material properties to determine process accuracy and/or produce process performance metrics. Process monitoring can be used to provide process feedback (e.g., to local control computers) that enables process adjustments (e.g., precursor gas flow or beam parameter adjustments, or automatic design layout database modification). Process feedback can occur during, and/or resulting process adjustments can be made for, the frame 710 in which corresponding photons or gas particles were collected, or one or more subsequent frames 710, or one or more subsequent processing cycles (e.g., for a subsequent layer, or for a subsequent substrate 704).

Local gas detectors 106 can be used for process monitoring, e.g., to monitor localized gas composition.

Local photon detectors 108 can be used to detect photons reflected or emitted from the substrate surface 706 near the beam impact location. Detected photons can be used to perform, for example, polarimetry, reflectometry, interferometry, or optical emission spectroscopy on substrate surface material. Substrate surface material properties indicated by such measurements generally include polarization, reflectivity, optical interference, temperature and material composition. Substrate surface material properties, and rates of change and higher-order derivatives of indicated properties, can be used to determine process endpoints, monitor process reaction rates, to monitor the temperature at (or in the vicinity of) the corresponding charged particle beam target impact location, to determine direct ALE or ALD etching or deposition rate, and for other process monitoring analyses.

In some embodiments, process endpoints for self-limiting reactions, such as those associated with direct ALE and ALD, can be monitored using independent photon detectors located on corresponding charged particle beam columns. Local photon detectors focused on frames containing reaction sites can receive a signal from photon emitting species that is orders of magnitude higher than what can be obtained from a photon detector with a field-of-view (FOV) that samples the entire chamber. Because the column array can monitor many reaction sites simultaneously, it can also monitor process uniformity across the wafer, allowing for more accurate timing of purge steps and an increase in overall throughput.

Different columns 206 can be configured and/or optimized to perform different (or multiple) types of direct ALE or ALD processes or other material processing, e.g., some columns 206 can be configured to perform direct ALE or ALD, while other columns 206 are configured to perform imaging (e.g., for alignment, registration and/or wafer inspection). The wide range of per-column 206 configurability disclosed herein means that beam columns 206 can be adapted to and optimized for a wide variety of substrate processing applications.

Figure 3A:
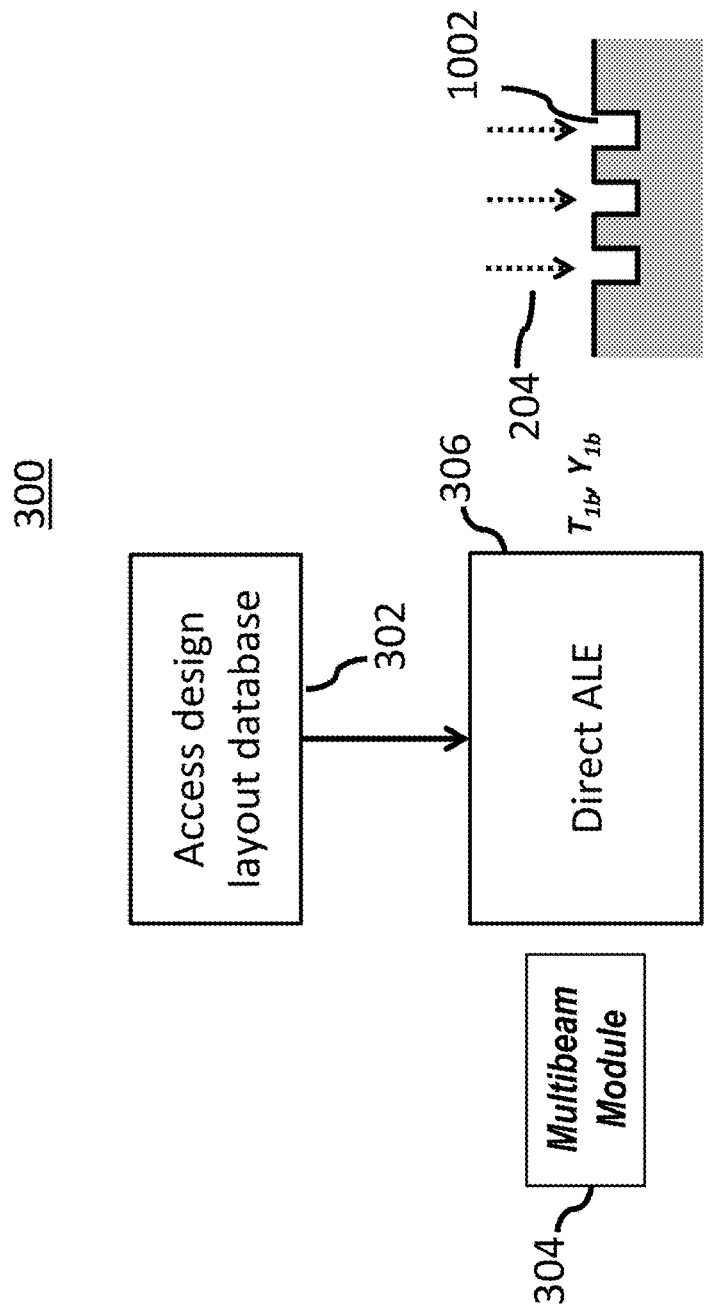
FIG. 3A shows an example of a process for direct atomic layer etching.

FIG. 3A shows an example of a direct ALE process 300 WITHOUT A RESIST LAYER. A design layout database is used to designate 302 where and how material will be etched on a substrate surface 706. A multibeam module 304 (e.g., a charged particle beam system 1100 or charged particle beam module 1202) is then used to perform ALE to directly etch material in a pattern and to atomically-precise layers as designated by the design layout database, using local gas and/or photon injectors 102, 104, and/or local gas and/or photon detectors 106, 108 in step 306. Example results of a direct ALE process 300 are also shown in FIG. 3A (uniform-depth 1002 etched regions are shown; differentiated-depth 1004 etched regions can also be produced).

Figure 2C:
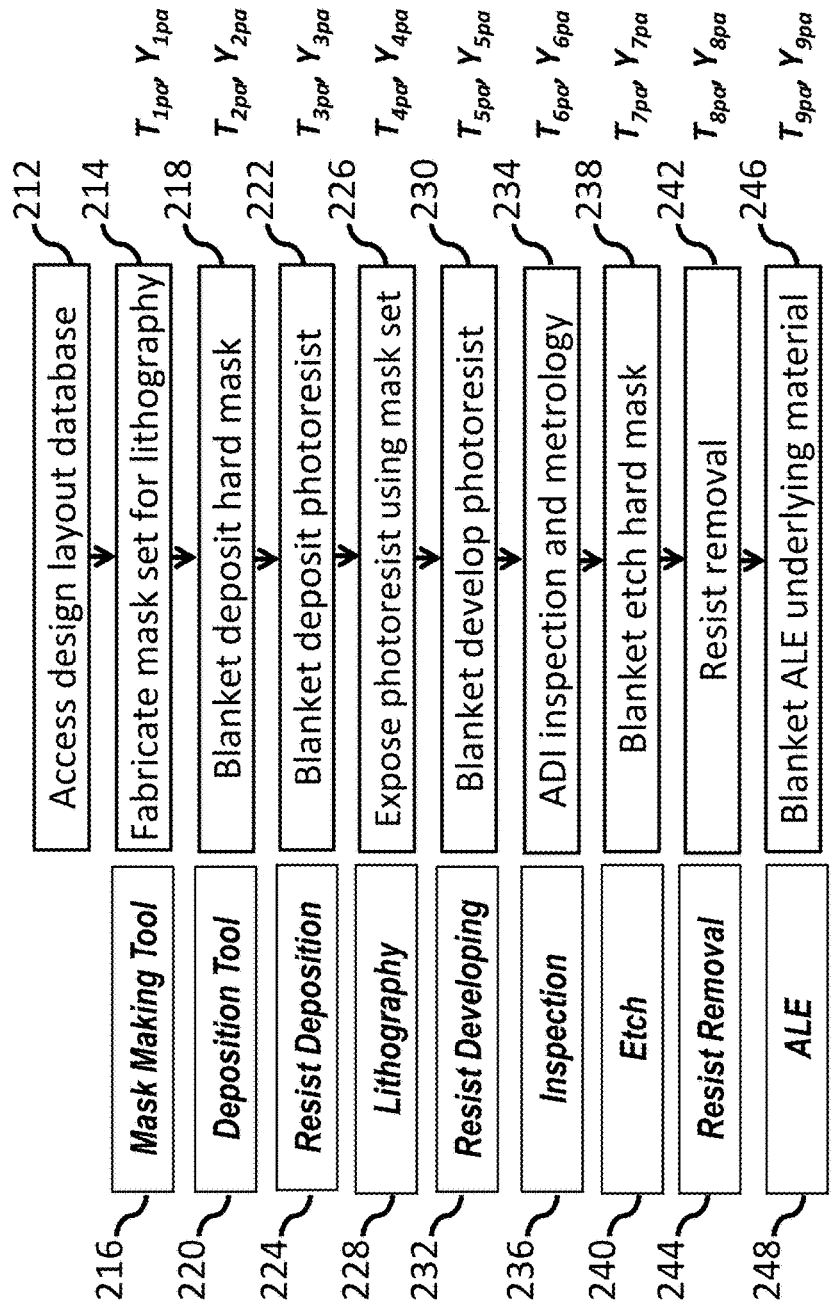
FIG. 2C shows an example of a process for atomic layer etching using prior art techniques.

The direct ALE process embodiment(s) shown in FIG. 3A dramatically reduces the number of steps required for patterned ALE—and, concomitantly, removes a wide variety of collateral sources of process-induced error, such as a large number of transitions between process tools—with respect to the process embodiment(s) using prior art techniques shown in FIG. 2C. See Equations 1 and 2. Consequently, manufacturing cycle time can be reduced and device yield can be increased using direct ALE with local injectors and detectors 102, 104, 106, 108 as disclosed herein.

Figures 3B, 3C:
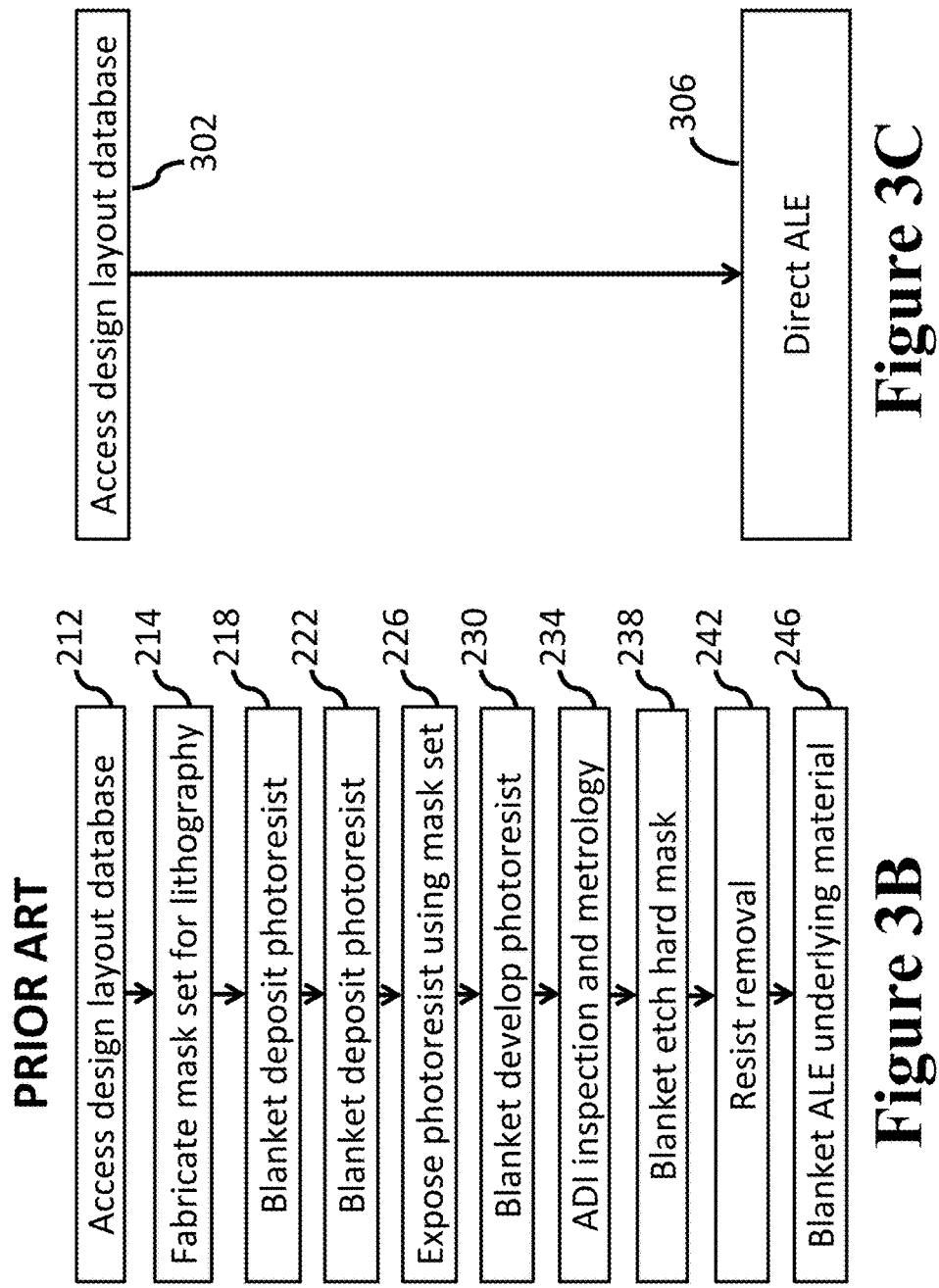
FIG. 3B shows an example of a process for atomic layer etching using prior art techniques.
FIG. 3C shows an example of a process for direct atomic layer etching.

FIG. 3B shows an example of an ALE process using prior art techniques (see FIG. 2C). FIG. 3C shows an example of a direct ALE process (see FIG. 3A).

Comparison between the embodiment(s) using prior art techniques of FIG. 3B and the innovative embodiment(s) of FIG. 3C helps to clarify the dramatic process simplification, and improvement in efficiency and yield potential, achieved by using multiple (preferably a large array 1102 of) miniature electrostatically-controlled charged particle beam columns 206, together with corresponding local gas and photon injectors and detectors 102, 104, 106, 108, to perform direct ALE.

Figures 4A, 4B:
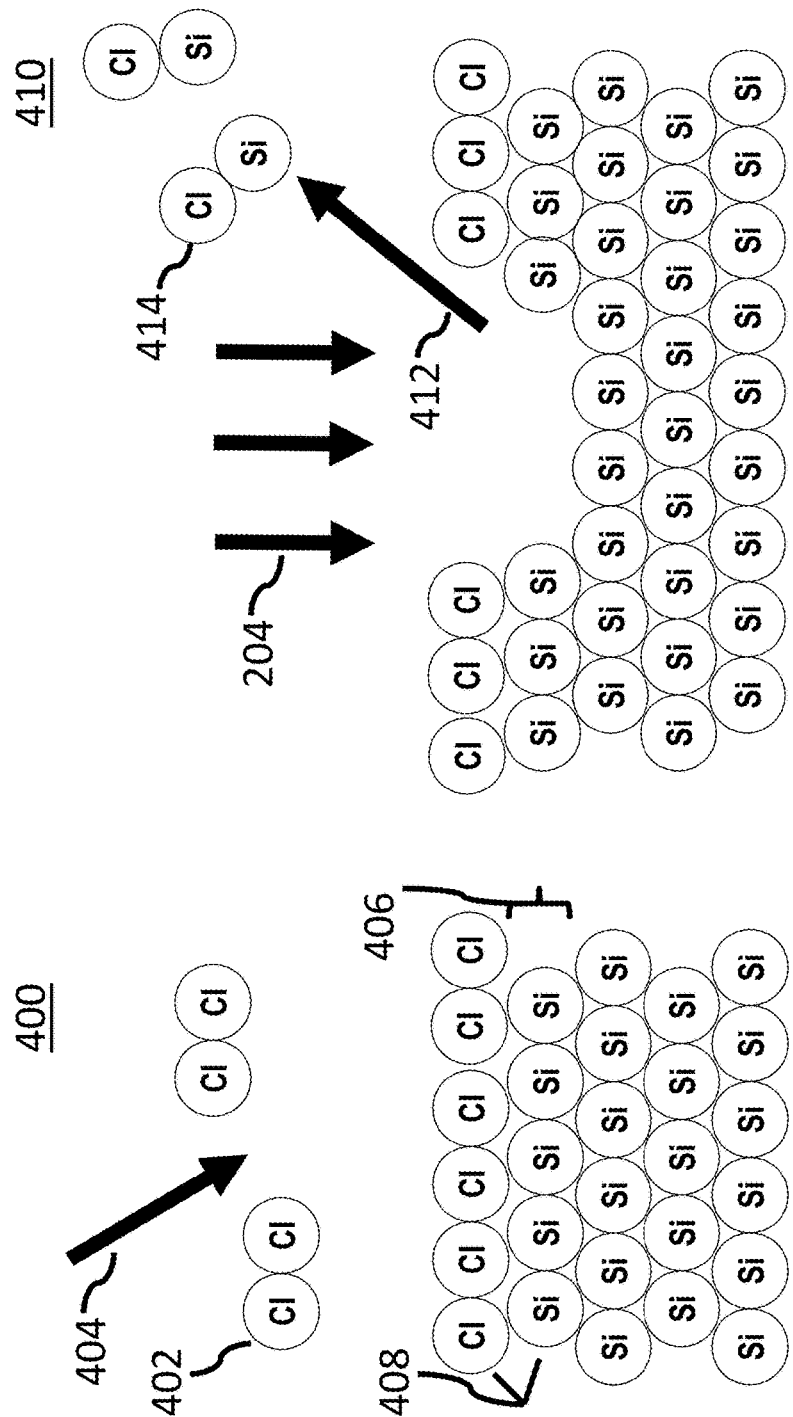
FIG. 4A shows an example process for atomic layer etching.
FIG. 4B shows an example process for atomic layer etching.

FIGS. 4A and 4B show an example process for direct ALE. As shown in FIG. 4A, a surface modification step 400 uses a reactive gas 402 (e.g., a halogen; in embodiments as shown in FIG. 4A, molecular chlorine) that is injected 404 by a local injector 102 and dissociatively adsorbed by an atomically-thin (in some embodiments, monatomically-thin, as shown in FIG. 4A) surface layer 406 of substrate surface material to form a reactive surface layer 408 (reaction $A_e$) that requires less energy to volatilize than the underlying substrate material.

The surface modification step 400 is followed, as shown in FIG. 4B, by a removal step 410 that volatilizes 412 the reactive surface layer 408 (reaction $B_e$) without damaging the underlying substrate (producing, in FIG. 4B, volatilized silicon-chlorine compounds 414, generally of the form $SiCl_x$, where x can be 1 to 4). Columns 206 comprising a charged particle beam column array 1102 can be individually controlled to provide ion or electron beam 204 energy for reaction $B_e$ only in locations designated by the design layout database, thus volatilizing 412 the reactive surface layer 408 to provide highly conformal patterned removal only in the targeted locations. Steps 400 and 410 are preferably performed serially (without overlapping the steps) to avoid (or minimize) random etching. (Reaction $B_e$ is a stochastic process. Energy provided by charged particle beams 204 greatly increases the rate of reaction $B_e$, which occurs—albeit at a very low rate—even without the added energy.)

The local substrate surface temperature (within the frame) and the reactive gas 402 are preferably selected such that the reactive surface layer 408 will not volatilize spontaneously at the local substrate surface temperature. The energy of the charged particle beam 204 is selected to be greater than the energy required to volatilize 412 the ((mon)atomically-thin) reactive surface layer 408, but less than the energy required to volatilize 412 other proximate substrate material.

FIGS. 4C, 4D, 4E and 4F show further iterations of steps 400 and 410 etching additional (mon)atomically-thin layers of substrate surface material, one layer at a time. Each of FIGS. 4C and 4D, and 4E and 4F, shows one process cycle comprising step 400 followed by step 410.

Figure 5A:
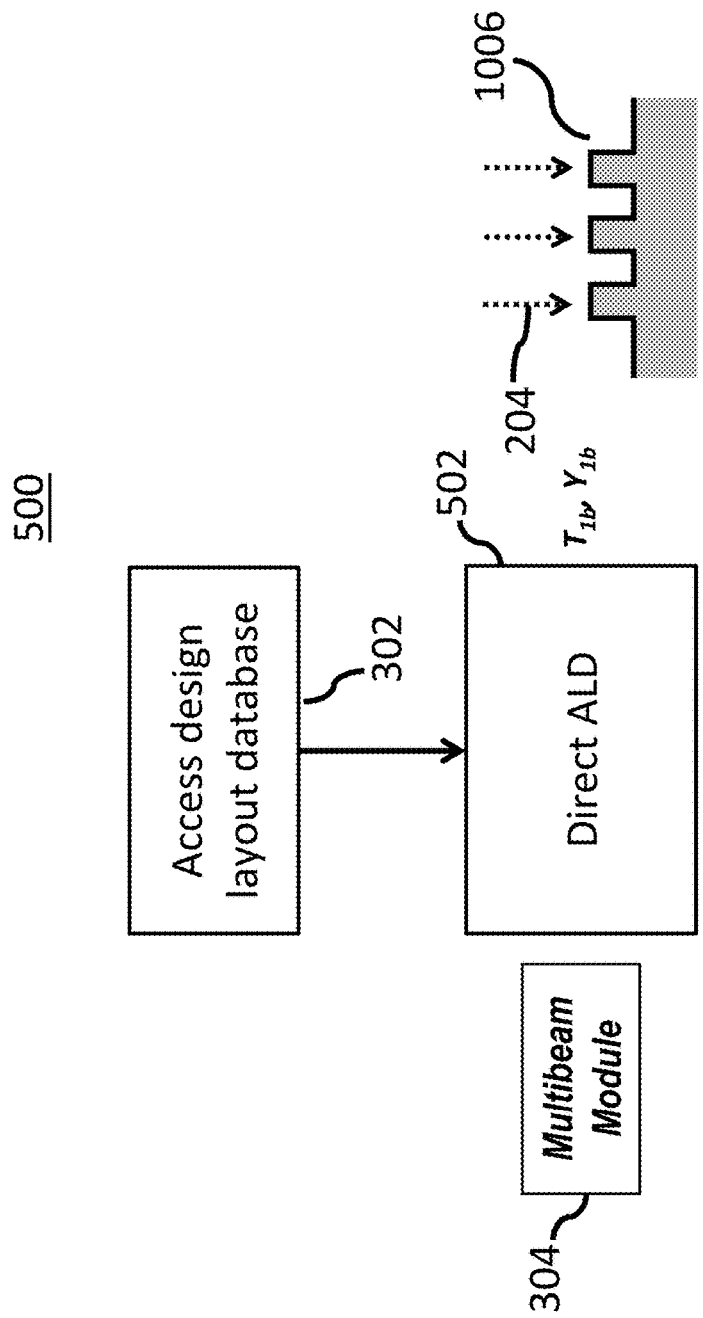
FIG. 5A shows an example of a process for direct atomic layer deposition.

FIG. 5A shows an example of a direct ALD process 500 WITHOUT A RESIST LAYER. A design layout database is used to designate 302 where and how material will be deposited on a substrate surface 706. A multibeam module 304 (e.g., a charged particle beam system 1100 or charged particle beam module 1202) is then used to perform ALD to directly deposit material in a pattern and to atomically-precise layers as designated by the design layout database, using local gas and/or photon injectors 102, 104, and/or local gas and/or photon detectors 106, 108 in step 502. Example results of a direct ALD process 500 are also shown in FIG. 5A (uniform-height 1006 deposited regions are shown; differentiated-height 1008 deposited regions can also be produced).

Figure 2D:
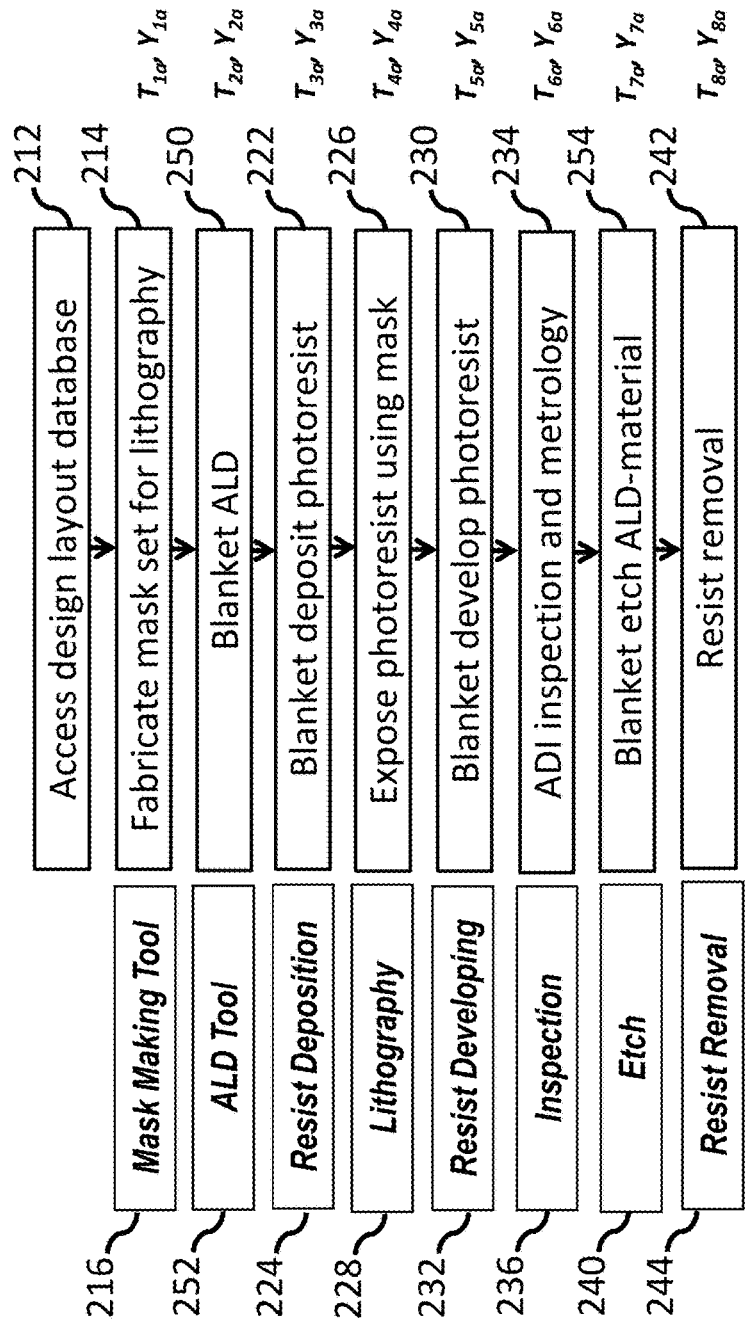
FIG. 2D shows an example of a process for atomic layer deposition using prior art techniques.

The direct ALD process embodiment(s) shown in FIG. 5A dramatically reduces the number of steps required for patterned ALD—and, concomitantly, removes a wide variety of collateral sources of process-induced error, such as a large number of transitions between process tools—with respect to the process embodiment(s) using prior art techniques shown in FIG. 2D. See Equations 1 and 2. Consequently, manufacturing cycle time can be reduced and device yield can be increased using direct ALD with local injectors and detectors 102, 104, 106, 108 as disclosed herein.

Figures 5B, 5C:
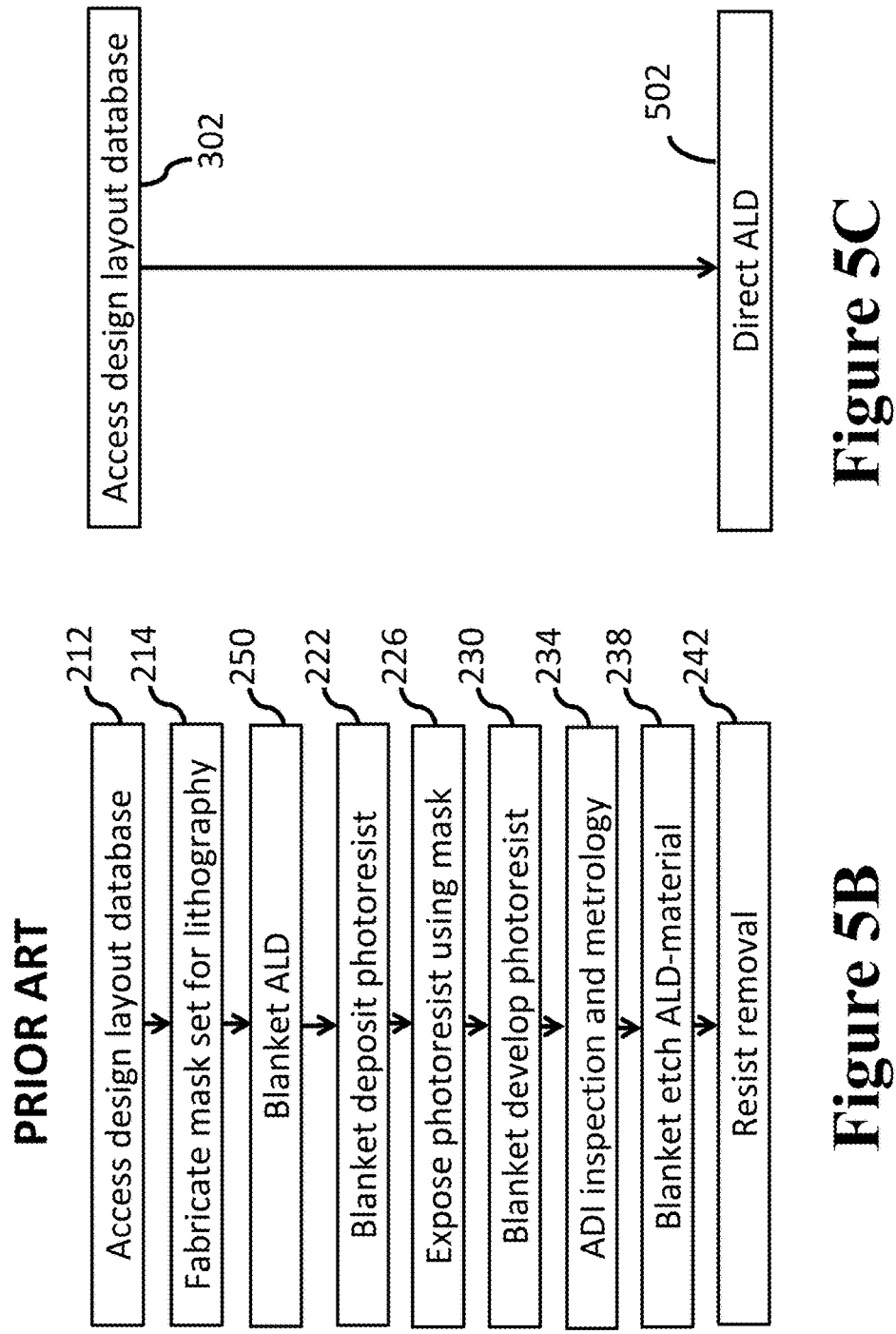
FIG. 5B shows an example of a process for atomic layer deposition using prior art techniques.
FIG. 5C shows an example of a process for direct atomic layer deposition.

FIG. 5B shows an example of an ALD process using prior art techniques (see FIG. 2D). FIG. 5C shows an example of a direct ALD process (see FIG. 5A).

Comparison between the embodiment(s) using prior art techniques of FIG. 5B and the innovative embodiment(s) of FIG. 5C helps to clarify the dramatic process simplification, and improvement in efficiency and yield potential, achieved by using multiple (preferably a large array 1102 of) miniature electrostatically-controlled charged particle beam columns 206, together with corresponding local gas and photon injectors and detectors 102, 104, 106, 108, to perform direct ALD.

Figure 6A:
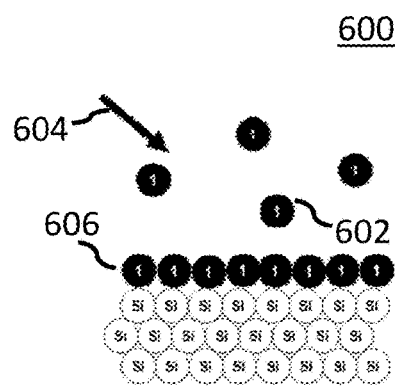
FIG. 6A shows an example process for atomic layer deposition.
Figure 6B:
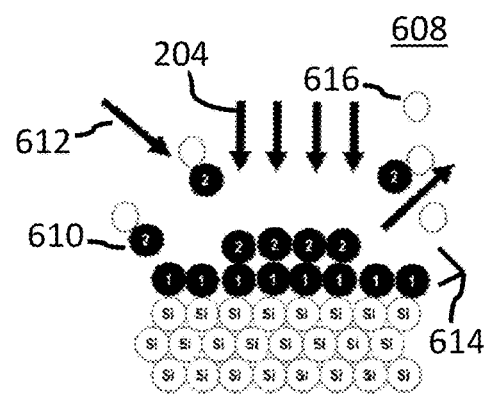
FIG. 6B shows an example process for atomic layer deposition.

FIGS. 6A and 6B show an example process for direct ALD.

As shown in FIG. 6A, a surface modification step 600 uses a reactive gas comprising a first species 602 ("1" in FIGS. 6A through 6D) that is injected 604 by a local gas injector 102 and reacts with a surface layer of a material (generally, the substrate 704, or the second species as described below) to form a half-reaction-cycle surface layer 606 by adsorption of the first species on the substrate surface 706 (reaction $A_d$). As shown in FIG. 6A, the first species 602 can be selected such that reaction $A_d$ is spontaneous at the local substrate surface temperature (within the frame).

As shown in FIG. 6B, reaction $A_d$ is followed by a second modification step 608, comprising adsorption of a second species 610 ("2" in FIGS. 6A through 6D) that is injected 612 by a local gas injector 102 and reacts with the first species 602 to form a desired deposition layer 614 (reaction $B_d$). Reactions $A_d$ and $B_d$ can result in reaction byproducts 616 which are pumped out of the chamber (e.g., by one or both of continuous pumping or a purge cycle). Columns 206 comprising a charged particle beam column array 1102 can be individually controlled to provide ion or electron beam 204 energy for reaction $B_d$ only in locations designated by the design layout database, thus adding highly conformal patterned layers deposited only in the targeted locations. The local substrate surface temperature (within the frame) and the first 602 and second 610 species are selected such that reaction $B_d$ does not occur spontaneously at the local substrate surface temperature. The energy of the charged particle beam 204 is selected to be greater than the energy required for reaction $B_d$, but less than the energy required to damage the deposited material or other proximate substrate material. (Reaction $B_d$ is a stochastic process. Energy provided by charged particle beams 204 greatly increases the rate of reaction $B_d$, which occurs—albeit at a very low rate—even without the added energy.) Steps 600 and 608 are performed serially, with second species injection 612 and introduction of beam energy to facilitate reaction $B_d$ concluding prior to a new iteration of step 600.

Figure 6C:
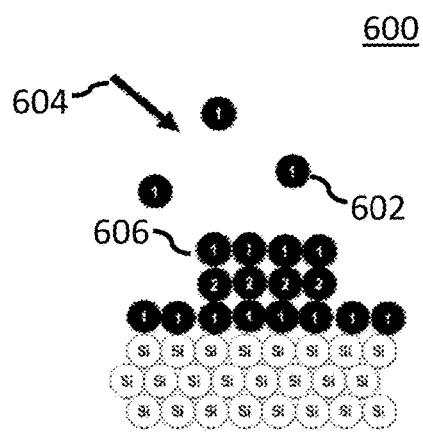
FIG. 6C shows an example process for atomic layer deposition.
Figure 6D:
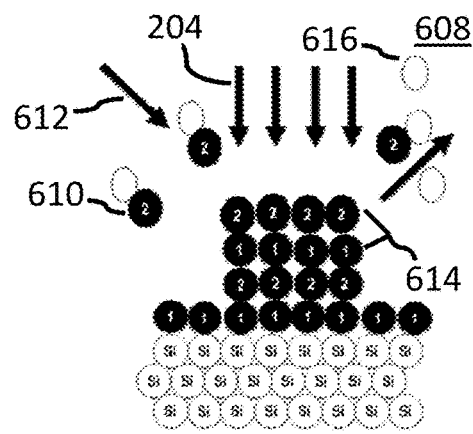
FIG. 6D shows an example process for atomic layer deposition.

FIGS. 6C and 6D show an example of repeated iterations of a direct ALD process as shown in FIGS. 6A and 6B.

Figure 6E:
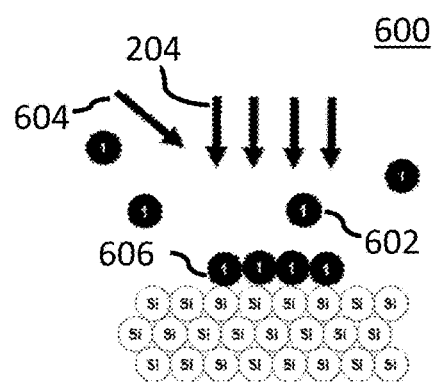
FIG. 6E shows an example process for atomic layer deposition.
Figure 6F:
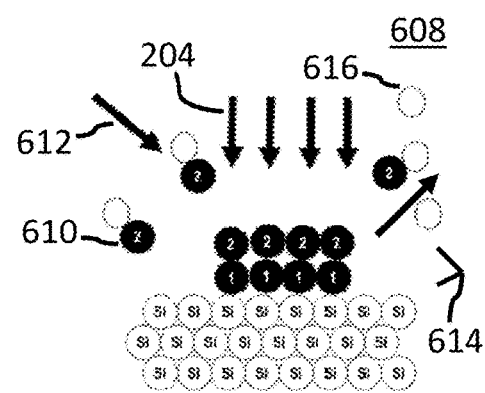
FIG. 6F shows an example process for atomic layer deposition.

In some other direct ALD embodiments, as shown in FIGS. 6E and 6F, the first species 602 is selected such that reaction $A_d$ is not spontaneous at the local substrate surface temperature. Columns 206 comprising a charged particle beam column array 1102 can be individually controlled to provide ion or electron beam 204 energy for reaction $A_d$ only in locations designated by the design layout database.

Figure 6G:
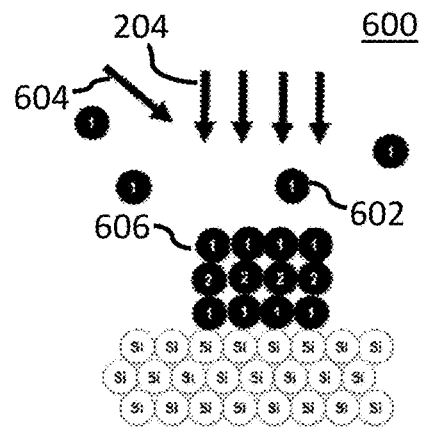
FIG. 6G shows an example process for atomic layer deposition.
Figure 6H:
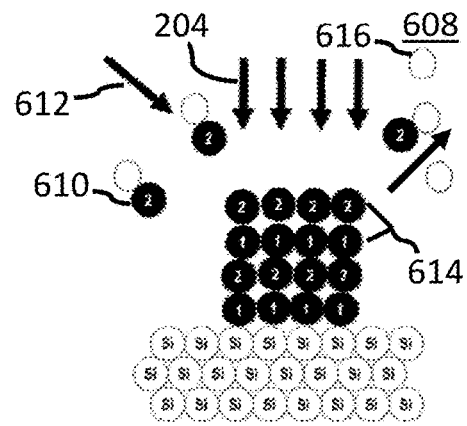
FIG. 6H shows an example process for atomic layer deposition.

FIGS. 6G and 6H show an example of repeated iterations of a direct ALD process as shown in FIGS. 6E and 6F.

Figure 6I:
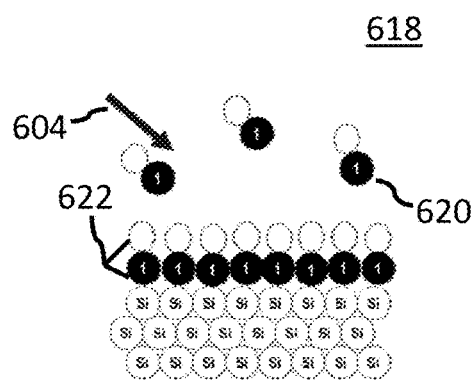
FIG. 6I shows an example process for atomic layer deposition.
Figure 6J:
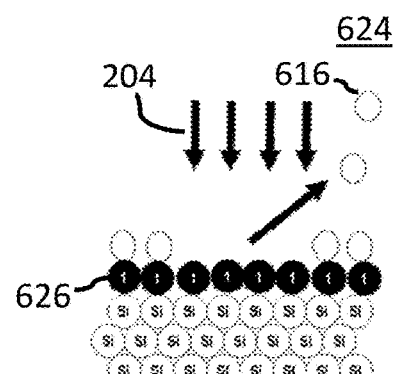
FIG. 6J shows an example process for atomic layer deposition.

FIGS. 6I and 6J show another example process for direct ALD. As shown in FIG. 6I, a surface modification step 618 uses a single species 620 which is injected 604 by a local gas injector 102 to form a precursor layer 622 by adsorption of the single species on the substrate 704 (reaction $A_{d2}$).

As shown in FIG. 6J, reaction $A_{d2}$ is followed by a second modification step 624 to form a desired deposition layer 626 (reaction $B_{d2}$). Reaction $B_{d2}$ results in byproducts 616 which are pumped out of the chamber (e.g., by one or both of continuous pumping or a purge cycle). Columns 206 comprising a charged particle beam column array 1102 can be individually controlled to provide ion or electron beam 204 energy for reaction $B_{d2}$ only in locations designated by the design layout database. The local substrate surface temperature (within the frame) and the species 618 are selected such that reaction $B_{d2}$ does not occur spontaneously at the local substrate surface temperature. The energy of the charged particle beam 204 is selected to be greater than the energy required for reaction $B_{d2}$, but less than the energy required to damage the deposited material or other proximate substrate material. Steps 618 and 624 are performed serially, with introduction of beam energy to facilitate reaction $B_{d2}$ concluding prior to a new iteration of step 618.

Figure 6K:
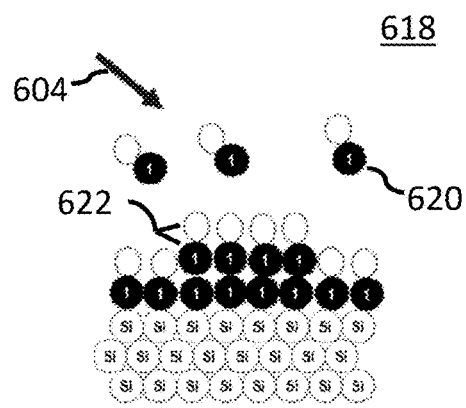
FIG. 6K shows an example process for atomic layer deposition.
Figure 6L:
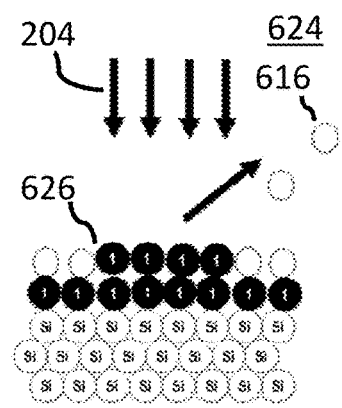
FIG. 6L shows an example process for atomic layer deposition.

FIGS. 6K and 6L show an example of repeated iterations of a direct ALD process as shown in FIGS. 6I and 6J.

Reactive gasses for ALE and ALD are preferably provided by independently controlled local gas injectors 102, which can induce local partial pressures of reactant gasses that are orders of magnitude higher than the ambient gas pressure in the vacuum chamber surrounding the column 206 array. This results in significantly reduced (or no) purging requirements, improving process cycle time and throughput, and can mitigate radical recombination issues in ALD processes. Purges can still be usefully performed, e.g., between gas injection steps (generally, the ratio of chamber pressure over local partial pressure of reactive gasses is proportional to required purge time with respect to blanket ALD processes), during transitions between different processes being performed on a substrate in a vacuum chamber (for example, a sequence such as ALE-purge-ALD), or between processing different substrates in the vacuum chamber. Advantageously, purges can be performed to coincide with otherwise necessary process transitions, or as determined by local photon and gas detectors.

Simultaneous, independent control of multiple charged particle beams and local gas injectors (and preferably local IR and/or UV photon injectors) allows a high degree of process control, e.g., deliberate intra-wafer and intra-die variation (including per-pass variation).

By using arrays of charged particle beams, targeted only in locations designated by the design layout database, to perform ALE and ALD, patterned resist and hard masks can be avoided, along with associated process overhead, process variation and defect introduction.

In some embodiments of ALE and ALD, gas detectors can be used to detect cycle endpoints, and photon detectors can be used to detect temperature and analyze other optical properties for ongoing process control, and to perform endpoint detection.

Figure 7A:
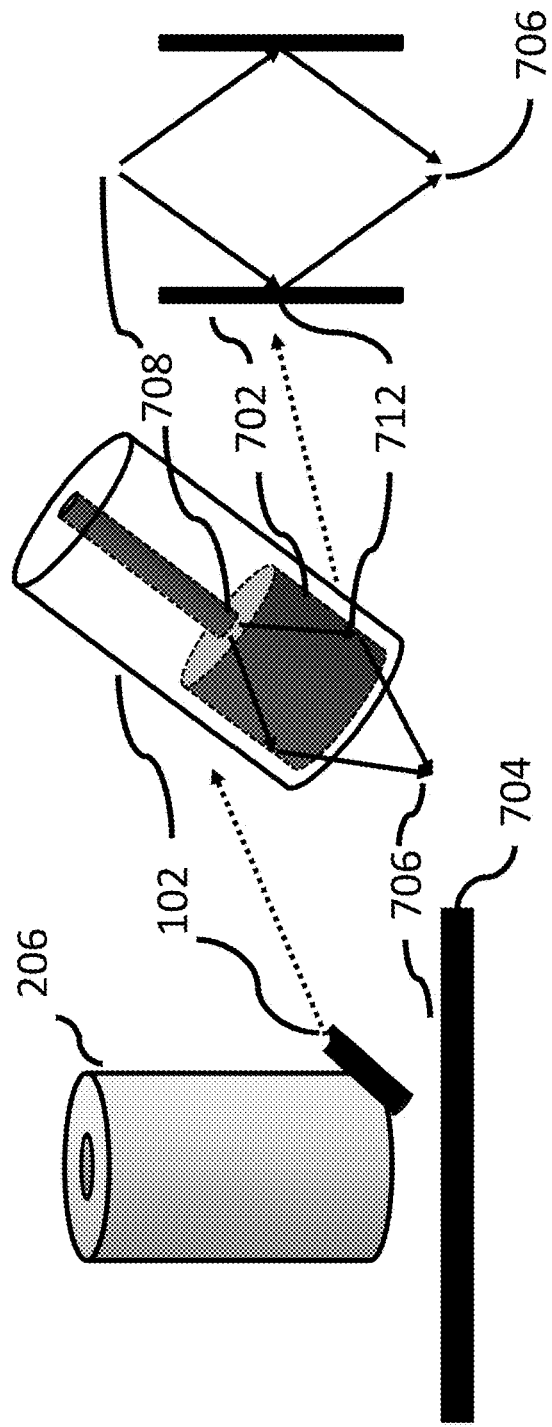
FIG. 7A schematically shows an example of a local gas injector mounted on a charged particle beam column.

FIG. 7A schematically shows an example of a local gas injector 102 mounted on a charged particle beam column 206. The gas injector preferably 102 includes a kinetic lens

702, comprising a smooth rigid body (preferably made of metal), to increase the partial pressure of gas at the focal point of the kinetic lens 702 on the substrate 704 surface 706 by focusing or collimating the gas particle flow from the gas injector outflow opening 708. Various designs of kinetic lens 702 are possible; the example shown in FIG. 7A is a cylindrical kinetic lens 702.

The gas injector 102 is connected to one or more gas sources, comprising the gas(ses) to be injected by the gas injector 102 to create or assist in creating a desired chemical environment at the main-field deflection area 710 on the surface of the substrate 706. Multiple gas injectors 102, injecting the same or different gasses, can be used.

Preferably, one or more local gas injectors 102 is configured to inject a reactive gas (appropriate to the particular ALE or ALD process) per column 206 performing ALE or ALD. Local gas injectors 102 are preferably mounted on or near the bottom of corresponding columns 206, as close to corresponding main-field deflection areas 710 as possible. (A main-field deflection area 710 is generally in a fixed position relative to the corresponding column 206, and moves across the substrate's surface 706 as the stage moves).

Gas flow from a local gas injector 102 is preferably limited to the molecular flow regime (not viscous flow) to enable proper function of a kinetic lens 702 connected to the gas injector outflow opening 708. (If the gas flow is in a viscous flow regime, the kinetic lens 702 will generally not function as a lens.) In the molecular flow regime ("molecular flow"), the mean free path for gas particles (atoms or molecules of the gas) is large compared to a characteristic dimension of the local gas injector 102 or detector 106 (e.g., the path taken by gas particles between the substrate surface 706 and the gas outflow or inflow opening 708, 714). This makes it much more likely that gas particles will collide 712 with the side of the lens 702, or (for a gas injector 102) the substrate surface 706, or (for a gas detector 106) enter the gas inflow opening 708, before hitting another gas particle.

A "kinetic lens" 702 is an arrangement of one or more smooth and rigid, flat and/or curved surfaces configured to reflect gas particles, fixed in position with respect to a corresponding gas injector outflow opening 708 or gas detector inflow opening 714; such that (for a gas injector) gas particles originating at a gas injector outflow opening 708 which intersect 712 with the kinetic lens 702 are collimated or redirected (e.g., focused) towards the corresponding main-field deflection area 710; and such that (for a gas detector 106) gas particles originating at the beam impact location (or the main-field deflection area 710) which intersect 712 with the kinetic lens 702 are redirected (e.g., focused) towards the gas detector inflow opening 714. (Generally, surfaces of a kinetic lens 702 can be thought of as similar to optical mirrors, but for gas particles.) Various designs of kinetic lens 702 can be used (see, for example, FIGS. 7A, 7B, 7C, 7D and 7E).

Preferably, kinetic lens 702 surfaces are arranged so that they do not prevent particles (atoms or molecules) of outflow gas within the kinetic lens 702 from reaching the substrate surface 706; and do not prevent particles of inflow gas within the kinetic lens 702, originating from the main-field deflection area 710 of the corresponding column 206, from reaching the inflow opening 714.

A kinetic lens 702 can be used to improve localization to the main-field deflection area 710 of increased partial pressure of an injected gas. A kinetic lens 702 can also be used to increase specificity and collection rate for a gas detector 106. "Specificity", as used herein, refers to the selectiveness of a gas detector 106 corresponding to a column 206 for material that originated within a corresponding frame 710 and not from, e.g., the frame 710 of another column 206.

Figure 7B:
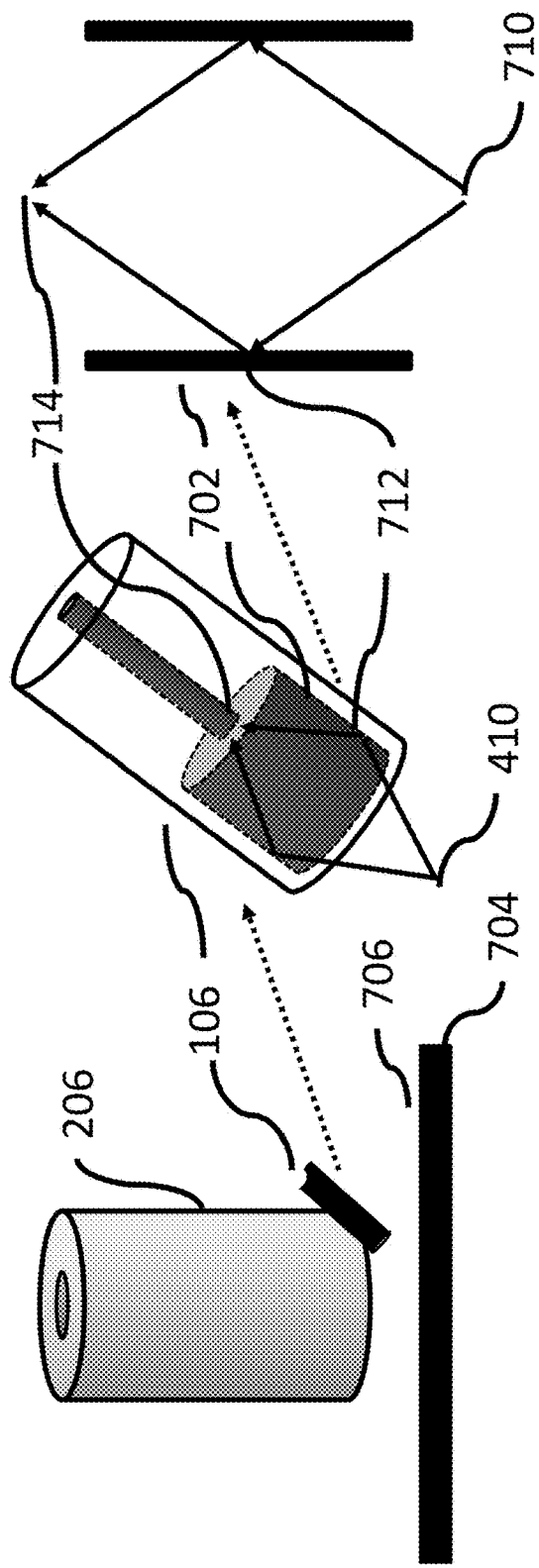
FIG. 7B schematically shows an example of a local gas detector mounted on a charged particle beam column.

FIG. 7B schematically shows an example of a local gas detector 106 mounted on a charged particle beam column 206. Preferably, a local gas detector 106 comprises a gas inflow opening 714 connected to a kinetic lens 702 configured to redirect gas particles intersecting 712 the kinetic lens 702 into the gas inflow opening 714. The gas inflow opening 714 is connected to a secondary ion mass spectrometer configured to analyze incoming gas particles and perform process monitoring and provide control feedback using said analysis.

FIG. 7C schematically shows an example of a gas injector 102 with a rotational ellipsoid kinetic lens 702.

FIG. 7D schematically shows an example of a gas detector 106 with a rotational ellipsoid kinetic lens 702.

A kinetic lens 702 is preferably shaped as a (truncated) rotational ellipsoid (an ellipsoidal reflector, with two equal minor axes and a longer major axis). Advantageously, gas particles which originate at one major axis focus and which intersect the kinetic lens 702 surface are reflected towards and converge at the other major axis focus. Preferably, one major axis focus of the rotational ellipsoid is located at the main-field deflection area 710 on the substrate surface, and the other major axis focus is located at the gas outflow or inflow opening 708, 714 (which can be modeled as a point source or point sink, respectively, for this purpose).

Preferred embodiments using gas injectors 102 use rotational ellipsoid kinetic lenses 702 configured such that gas particles originating at the gas injector outflow opening 708 that intersect 712 the kinetic lens surface 702 are reflected towards the main-field deflection area 710, increasing partial pressure of the gas in the frame 710.

Preferred embodiments using gas detectors 106 use rotational ellipsoid kinetic lenses 702 configured such that gas particles originating in the main-field deflection area 710 are reflected towards the gas detector inflow opening 714, significantly improving gas detector 106 collection efficiency and specificity (thus improving, e.g., sensitivity and signal to noise ratio of gas spectrometer measurement and analysis).

FIG. 7E shows an example of a gas injector 102 or gas detector 106 with a kinetic lens 702. Approximations of a rotational ellipsoid can be made using flat and/or curved surfaces configured to reflect (at least some trajectories of) gas particles originating at one (approximate) focus towards the other (approximate) focus.

FIG. 8 schematically shows an example of a photon injector 104 and a photon detector 108 mounted on a charged particle beam column 206. Preferably, a photon injector 104 comprises a light source optically connected by an optical fiber to a (cylindrical) rod lens focused on the main-field deflection area 710; and a photon detector 108 comprises a light sensor optically connected by an optical fiber to a rod lens focused on the main-field deflection area 710.

Photon injectors 104 and photon detectors 108 can be used as discussed above. Further, as shown in FIG. 8, a photon injector 104 and photon detector 108 pair can be arranged so that photons emitted by a photon injector 104 are reflected off the substrate 704 and collected by the paired photon detector 108. The photon injector 104 used for this purpose can be used specifically to provide photons for the photon detector 108 to perform, e.g., polarimetry, reflectometry, interferometry or optical emission spectroscopy. Alternatively, the photon injector 104 can be dual-purpose, e.g., the detected photons can be IR photons emitted by the photon injector 104 for temperature control, or photons emitted to excite substrate surface material electrons or adsorbed material electrons to facilitate a desired substrate surface chemistry, or to perform highly localized photon-induced dissociation.

Injected photons can also be pulsed, e.g., to enable local temperature measurement, or optical emission spectroscopy of photons emitted by substrate surface material, in between pulses.

A cooled substrate 1104 (e.g., indirectly cooled by the chuck) can also be used to assist in increasing the adsorption rate of reactant and other process-critical gases on the substrate 704, and/or to keep the average temperature of the substrate approximately constant at a designated temperature (and that temperature can be modified locally by photon injectors 104). The average temperature of the substrate 704 can be monitored and controlled by a substrate temperature control 802.

Figure 9:
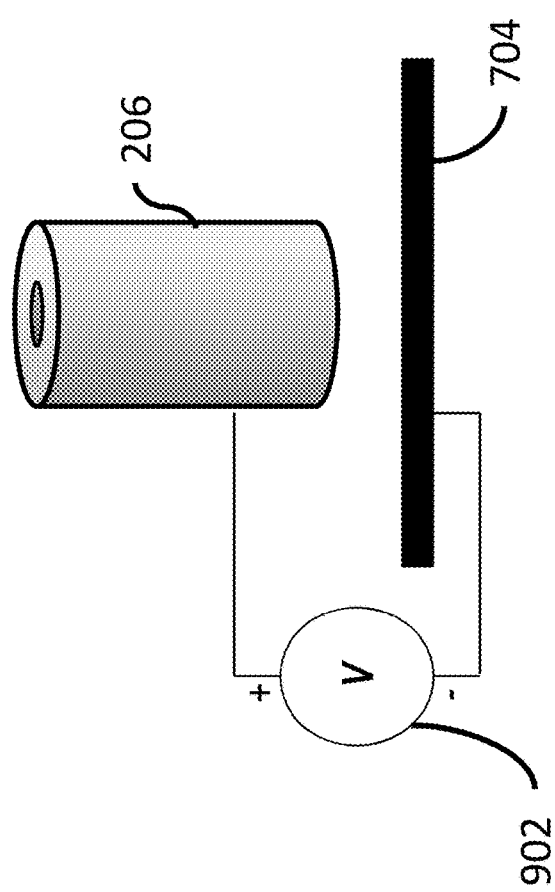
FIG. 9 schematically shows an example of a voltage bias applied between a charged particle beam column and a substrate.

FIG. 9 schematically shows an example of a voltage bias 902 applied between a charged particle beam column 206 and a substrate 704 to control charged particle impact over a wide range of energies.

Substrate electrical bias 902 can be used, along with control of beam energy at each column 206, to optimize the efficiency of charged-particle induced chemistry and/or physical effects. Preferably, beam energy is constant (or changes slowly and/or rarely). As the desired substrate surface chemistry changes (which can include, for example, a gas injector output changing), the electrical bias 902 of the substrate 704 can be changed so that the total landing energy of an individual charged particle beam 204 (including energy contributed by the substrate electrical bias 902) is (or is significantly closer to) the landing energy that will optimize the rate and/or efficiency of the desired reaction(s), e.g., volatilization of or deposition reaction with reactive substrate layers that have adsorbed reactive (ALE or ALD process) gas(ses).

Figure 10A:
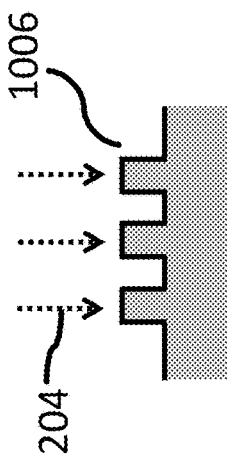
FIG. 10A schematically shows an example of the results of uniform-depth atomic layer etching.
Figure 10B:
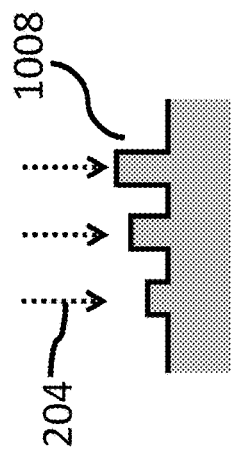
FIG. 10B schematically shows an example of the results of differentiated-depth atomic layer etching.
Figure 10C:
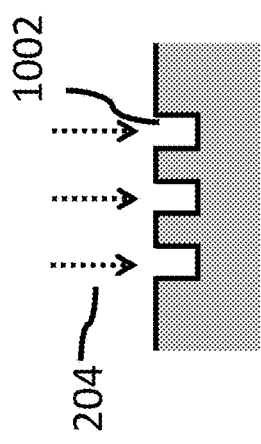
FIG. 10C schematically shows an example of the results of uniform-height atomic layer deposition.

FIGS. 10A and 10C schematically show examples of the results of uniform-depth direct ALE 1002 (FIG. 10A) and uniform-height direct ALD 1006 (FIG. 10C), respectively.

Figure 10D:
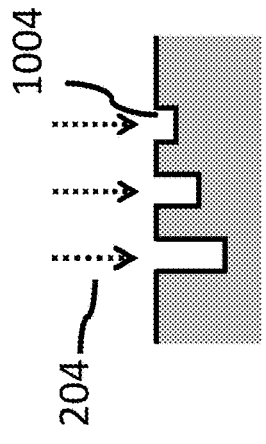
FIG. 10D schematically shows an example of the results of differentiated-height atomic layer deposition.

FIGS. 10B and 10D schematically show examples of the results of differentiated-depth direct ALE 1004 (FIG. 10B) and differentiated-height direct ALD 1008 (FIG. 10D), respectively.

Columns 206 can be configured independently to process material simultaneously but differently; e.g., to write different patterns to different depths or heights using different beam and injection parameters. Since columns 206 are controlled independently, they can be used to create local variations in ALE and ALE profiles. Differentiated-profile direct ALE and ALD can be achieved by varying, for example, targeted beam positions for different ALE or ALD cycles.

Figure 11:
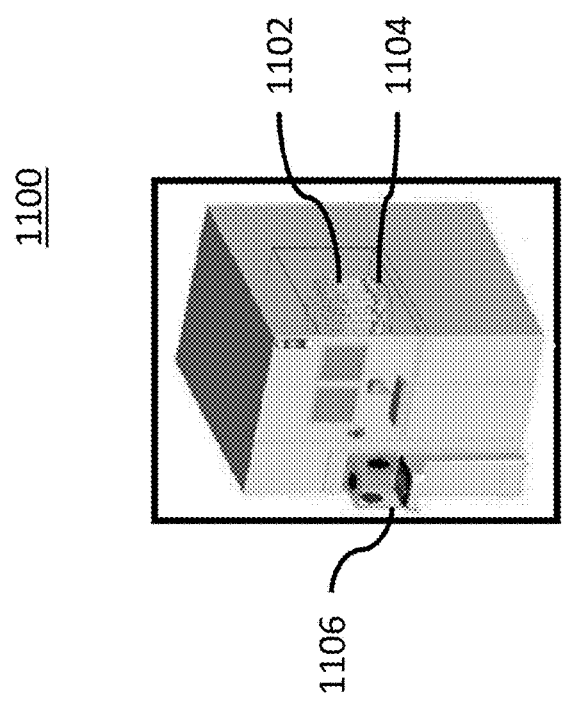
FIG. 11 schematically shows an example of a multiple column charged particle beam system FIG. 12 schematically shows an example of a charged particle beam cluster tool.

FIG. 11 schematically shows an example of a multiple column charged particle beam system 1100. An appropriately configured multi-column charged particle beam system 1100 can be used for direct ALE and/or ALD. The system shown in FIG. 8 includes an array 1102 of miniature charged particle beam columns 206, a substrate stage with chuck 1104, a substrate loading and unloading mechanism 1106, control electronics, a vacuum system, an alignment system, vibration isolation and magnetic shielding. Depending on (for example) the particular direct ALE or ALD application intended, a multi-column charged particle beam system 1100 preferably also includes one or more of local gas injectors 102, local photon injectors 104, local gas detectors 106 and local photon detectors 108.

Figure 12:
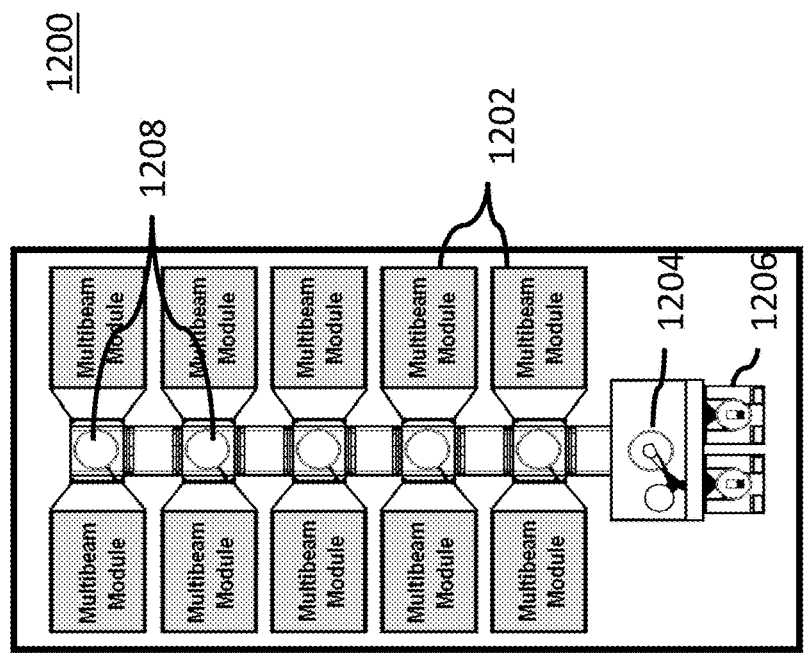

FIG. 12 schematically shows an example of a charged particle beam cluster tool 1200. A charged particle beam cluster tool 1200 comprises multiple charged particle beam modules 1202. An individual charged particle beam module 1202 comprises an array 1102 of charged particle beam columns 206 in ultra high vacuum, as well as a wafer stage 1104 and alignment mechanism. Individual modules 1202, and/or individual columns 206 within a module 1202, can be configured to specialize in a particular type of charged particle beam substrate processing. For example, one module 1202 can be configured for direct ALE, while a second module 1202 is configured for direct ALD. In another example, some columns 206 in a module 1202 can be configured to perform direct ALE while other columns 206 in that module 1202 are configured and optimized for substrate inspection using electron beam imaging.

In addition to process modules 1202, a cluster tool 1200 generally also comprises a substrate handling system 1204, a substrate loading/unloading system 1206 and a factory interface. Within a cluster tool 1200, a wafer transport system 1208 delivers wafers to one or more—in some embodiments, all (e.g., sequentially)—of the tool's process modules 1202, and can also perform pre-alignment (in-vacuum or out-of-vacuum). Other sub-systems necessary for charged particle beam control, gas injection, and substrate processing are not depicted (e.g. control electronics, vacuum systems, alignment systems, vibration isolation, magnetic shielding and gas injection flow control and measurement).

As will be understood by one of ordinary skill in the arts of ALE and/or ALD, focus areas described in this application of gas and photon injectors and detectors 102, 104, 106, 108 (typically, the main-field deflection area 710) are approximate; that is, they comprise the described area, within (plus or minus) the range or error allowed by the particular process (and/or application) performed by the corresponding column 206, such that the desired function, effect and/or accuracy of that process (and/or application) are preserved.

According to some but not necessarily all embodiments, there is provided: A method for targeted atomic layer etching of material from a substrate using multiple charged particle beam columns, individual columns projecting individual charged particle beams at the substrate, comprising the actions of: a) injecting at least one gas, using multiple local gas injectors, onto multiple different frames corresponding to multiple different ones of the beams, said gas selected to be adsorbed by and lower a dissociation energy of an exterior layer of the substrate surface; and b) scanning said frames using said corresponding beams, locations in said frames being targeted by said beams in dependence on the design layout database, wherein a beam energy of said corresponding beams is selected to increase the rate of dissociation from the substrate body only of said targeted locations of said layer that adsorbed said gas; wherein steps a) and b) are performed serially.

According to some but not necessarily all embodiments, there is provided: A method for targeted atomic layer deposition of material onto a substrate using multiple charged particle beam columns, individual columns projecting individual charged particle beams at the substrate, comprising the actions of: a) injecting at least one gas, using ones of multiple local gas injectors, onto multiple different frames corresponding to multiple different ones of the beams, said gas selected to be adsorbed by the substrate surface; b) injecting at least one other gas, using ones of said local gas injectors, onto said frames, said gas selected to react with said adsorbed gas to form a deposited layer; and c) scanning said frames using said corresponding beams, locations targeted by said beams being designated by the design layout database, wherein a beam energy of said corresponding beams is selected to provide the energy for said step b) reaction; wherein said steps a) and b) are performed serially, and wherein said injecting and said scanning are performed differently and simultaneously by different ones of said local gas injectors and said columns.

According to some but not necessarily all embodiments, there is provided: A method for targeted atomic layer deposition of material onto a substrate using multiple charged particle beam columns, individual columns projecting individual charged particle beams at the substrate, comprising the actions of: a) serially injecting, using multiple local gas injectors, an initial gas and then another gas onto multiple frames corresponding to multiple different ones of the beams, said initial gas selected to be adsorbed by the substrate, said another gas selected to react with said initial adsorbed gas to form a deposited layer; and b) scanning said frames using said corresponding beams, locations being targeted by said corresponding beams in dependence on the design layout database, wherein a beam energy of said beams is selected to provide the energy for said adsorption and/or said reaction.

According to some but not necessarily all embodiments, there is provided: Methods and systems for direct atomic layer etching and deposition on or in a substrate using charged particle beams. Electrostatically-deflected charged particle beam columns can be targeted in direct dependence on the design layout database to perform atomic layer etch and atomic layer deposition, expressing pattern with selected 3D-structure. Reducing the number of process steps in patterned atomic layer etch and deposition reduces manufacturing cycle time and increases yield by lowering the probability of defect introduction. Local gas and photon injectors and detectors are local to corresponding columns, and support superior, highly-configurable process execution and control.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

In some embodiments, multibeam tools comprising electrostatically-deflected charged particle beam columns using local gas and/or photon injectors and/or detectors can also be used to perform other substrate manufacturing processes, particularly: addition of materials to a substrate surface as designated by a design layout database and localized to substrate positions directly affected by said beams (material addition); removal of substrate materials from the substrate surface as designated by a design layout database and localized to substrate positions directly affected by said beams (material subtraction); and modification of materials on or in the substrate as designated by a design layout database and localized to substrate positions directly affected by said beams (direct material modification).

In some embodiments, (preferably minimal) overlap of writing areas can be allowed to ensure complete access to useful substrate surface by charged particle beams.

As will be apparent to one of ordinary skill in the arts of charged particle beam ALE, though direct ALE has been disclosed with respect to etching of atomically-thin layers, etching of precisely-determined non-monatomic atomic thickness can also be performed on certain substrate materials.

In some embodiments of ALD, one or more of the reaction steps can be self-aligning; in embodiments as shown in FIGS. 6E and 6F, the second species can be selected to be adsorbed by and/or to react only (in context) with the first species (post-reaction $A_d$), reducing accuracy requirements for charged particle irradiation for reaction $B_d$ (or allowing blanket irradiation).

In some embodiments of ALE or ALD, one or more of the reaction steps can be selective to one or more materials in or on a pre-patterned substrate. For example, in embodiments as shown in FIGS. 4A and 4B, or 6I and 6J, the first species can be selected to be adsorbed by and/or to react only (in context) with oxide surfaces or with metal surfaces on the substrate, reducing accuracy requirements for charged particle irradiation for reaction $B_e$ or $B_d$ (respectively). In some embodiments, as shown in FIGS. 6E and 6F, the first species can be selected to be adsorbed by and/or to react only (in context) with oxide surfaces or with metal surfaces on the substrate, reducing accuracy requirements for charged particle irradiation for reaction $A_d$.

As will be apparent to one of ordinary skill in the arts of ALE and/or ALD, other self-limiting processes than those described above can be used to perform ALE or ALD, and at least some of those other self-limiting processes can be configured such that charged particle beam energy is necessary and sufficient to provide reaction energy for at least one required reaction step.

Though certain embodiments have been disclosed herein using particular types of adsorption, one of ordinary skill in the arts of charged particle beam ALE and/or ALD will understand that in some embodiments, various types of surface reactions can be used, e.g., dissociative adsorption, ligand exchange and associative chemisorption.

In some embodiments, local (IR) photon injectors can be used to accelerate purging of excess reactants from the substrate surface.

In some embodiments of direct ALD, after targeted charged particle beams have been used to enable a reaction expressing pattern in ALD-deposited material, one or more subsequent layers can be deposited using a blanket thermal ALD process (using heat, preferably sourced from local photon injectors, to provide energy for ALD adsorption and/or deposition reactions) self-aligned to the initial patterned layer.

In some embodiments of direct ALD using multiple miniature-column electrostatically-deflected charged particle beams (see description herein regarding, e.g., FIGS. 6E through 6H), the second species is selected such that reaction $B_d$ is spontaneous at the local substrate surface temperature, and reaction $A_d$ is non-spontaneous at the local substrate surface temperature (first and second species can be selected such that either or both—at least one—of reactions $A_d$ and $B_d$ are non-spontaneous at the local substrate surface temperature).

In some embodiments, targeted locations for direct ALD and/or ALE can be selected to comprise one or more "Hadamard targets" to be used as anti-tamper devices, identification data (uniquely identifying a product, type, version, batch, lot, substrate, die or individual device, or intended user, or other grouping of devices bearing the data), security codes (e.g., public and/or private encryption keys), watermarks, anti-counterfeiting codes, or addressing data (e.g., MAC addresses or IPV6 addresses). In some embodiments, the specificity of the technology to accurately (and rapidly) write and/or image such precise encoding, in a selected size (in some embodiments, at beam resolution limits) and material composition, can be used to enhance security of such codes.

A "Hadamard target" is a pattern generated using functions or algorithms used to calculate the Hadamard and/or Walsh transform(s); wherein transform output vector reordering (per-vector reordering, not within vectors) is permitted; wherein the N rows and columns that would have the fewest sign changes (write/do-not-write transitions) after sequency reordering of the Hadamard matrix can be removed; wherein additional permutations are then permitted if they preserve edges (write/do-not-write transitions) corresponding to adjacent sub-blocks within a block; and wherein transposition of entire blocks is then permitted. (Sequency ordering arranges the transform output vectors in order of the number of sign changes per vector.) Unmodified Hadamard transform outputs have a large amount of x and y edge information and block-to-block pattern uniqueness. Those of ordinary skill in the art of lithographic patterning and inspection using charged particle beams will understand that such reordering and permutation should be chosen to retain sufficient x and y edge information and block-to-block pattern uniqueness to enhance signal-to-noise ratio and enable rapid determination of which block is being imaged during inspection. Preferably, the binary correlation between pairs of blocks in a Hadamard target should be 0 to enhance block-to-block pattern uniqueness.

In some embodiments, different columns in an array can be configured with beam column parameters and/or gas injection parameters to perform direct ALE and/or ALD at different rates.

In some embodiments of direct ALE and/or ALD, local photon injectors can inject onto corresponding frames photons having a wavelength selected to cause desorption of one or more of adsorbed: process-critical gas(ses) or impurities therein, byproducts of adsorption of process-critical gasses or of (ALE) etch-induced dissociation of substrate surface material, gasses injected by gas injectors local to non-corresponding columns, and ambient gasses in the vacuum chamber.

In some embodiments, direct ALE (targeted in direct dependence on a design layout database) can be performed to etch through a blanket-deposited hardmask layer, and conventional etch can be performed on the resulting patterned hardmask layer to express that pattern in the underlying material.

In some embodiments, ion beam columns can be matched to electron beam columns by calibrating deflection parameters (and/or other column parameters) to take into account beam composition (and other column configuration) differences.

In some embodiments, ion beam columns are matched to ion beam columns, and electron beam columns are matched to electron beam columns, but ion beam columns are not matched to electron beam columns.

In some embodiments, patterns can be designed to increase the average number of features per frame that contains features, and/or to increase the number of frames that contain no features; e.g., to take advantage of per-frame localization of endpoint detection and process monitoring, and/or to improve signal-to-noise ratio of process measurements and analysis.

In some embodiments, a column (i.e., with particular injectors and/or detectors) can be used to perform more than one direct ALE or ALD process type or other substrate process (e.g., imaging for purposes of defect detection or metrology) without changing the column's physical configuration.

In some embodiments, a physical configuration of a column can be specialized and/or optimized to perform a single direct ALE or ALD process type or other substrate process (e.g., imaging for purposes of defect detection or metrology).

In some embodiments, the body of an injector or detector interpenetrates the housing of a column (without interfering with charged particle beam path-related structures, or the beam itself).

In some embodiments, in which there is a mechanical impediment preventing making an injector or detector local, the injector or detector is located outside the perimeter of the corresponding column but within the writing area of the column.

In some embodiments, a local injector or detector is located between the column and the substrate surface.

In some embodiments (e.g., for some direct ALE or ALD processes and/or applications and/or other substrate manufacturing processes), there is a near-linear inverse proportionality between gas partial pressure increase within the main-field deflection area and direct ALE or ALD cycle time (e.g., when gas partial pressure is the rate-limiting parameter).

In some embodiments, one or more columns perform ALE or ALD corresponding to multiple layers of pattern in a single pass—e.g., within a single process cycle, on multiple layers in one or more frames (separate main-field deflection areas). In some such embodiments, different direct ALE or ALD process types are used to perform direct ALE or ALD on different ones of said multiple layers in a particular frame.

In some embodiments, local gas and/or photon detectors can be used to generate persistent per-column performance metrics.

In some embodiments, gas and/or photon injection can be performed prior to charged particle beam scanning, e.g., to prepare the substrate surface in advance.

Though particular combinations of local gas and photon injectors, and local gas, photon and electron detectors have been described herein, one of ordinary skill in the arts of ALE and/or ALD using charged particle beams will understand that various other combinations (in various physical arrangements), including some or all of said local injectors and detectors, with one or more of ones of said injectors and detectors local per column, can be used to configure a column and to perform direct ALE and/or ALD as disclosed herein.

In some embodiments, local detectors (local and corresponding to one or more columns) can be limited to local electron detectors used for critical dimension (CD) metrology or overlay (accurate placement of a pattern layer over one or more prior pattern layers), local photon detectors used for localized temperature monitoring, and local gas detectors used for localized process monitoring.

In some embodiments, local detectors can be limited to local electron detectors used for CD metrology or overlay.

In some embodiments, local detectors can be limited to local photon detectors used for localized temperature monitoring or process monitoring, e.g., in applications where overlay is not required.

In some embodiments, a local gas injector focuses gas particles on an area larger than the main-field deflection area; in some embodiments, a local gas injector does so for advance preparation of adjacent frames.

In some embodiments, a local gas detector can be used to perform analysis of gas particles with techniques other than secondary ion mass spectrometry.

In some embodiments, a kinetic lens is atomically smooth.

In some embodiments, the largest diameter of a kinetic lens is significantly larger than the diameter of the corresponding gas outflow or inflow opening.

In some embodiments, a kinetic lens is fixedly connected to a gas injector outflow or a gas detector inflow so that gas particles cannot escape from the connection between the kinetic lens and the corresponding gas outflow or inflow opening.

In some embodiments, a kinetic lens is wholly or partially nonmetallic.

In some embodiments, a kinetic lens is shaped such that few or no possible gas particle trajectories originating at an intended gas particle source (generally, the main-field deflection area or a corresponding gas injector opening) will result in a gas particle being "trapped" within the kinetic lens. In some embodiments, a kinetic lens is shaped such that few or no possible gas particle trajectories originating at an intended gas particle source will be reflected by the kinetic lens such that the gas particle moves closer to said source and further from the intended destination (generally, a corresponding gas detector opening or the main-field deflection area).

In some embodiments, a frame-facing kinetic lens opening is smaller than the largest diameter (orthogonal to the main axis) of the kinetic lens.

While particular examples of kinetic lens shapes have been described hereinabove, it will be apparent to one of ordinary skill in the arts of charged particle beam substrate ALE and/or ALD that other kinetic lens shapes can also be used to stochastically increase partial pressure in the main-field deflection area (e.g., through gas flow collimation and focusing). For example, ellipsoids with three different axes, paraboloidal reflectors, or elongated truncated tapering flat-sided or curved-sided horns.

In some embodiments, photon injectors and/or photon detectors can be fixed in position with respect to a corresponding individual column and disposed non-locally to that corresponding column, as long as they are able to focus sufficient emitted photons on, or collect sufficient emitted photons from, the main-field deflection area of said corresponding column (or larger area within the corresponding writing area) to effectively function in support of the particular direct ALE and/or ALD process(es) in which they are used.

In some embodiments, one or more lasers, e.g., diode lasers, provide the light source for a local photon injector.

In some embodiments, wavelength and/or wavelength range and/or distribution of photons emitted by a photon injector is tunable.

In some embodiments, non-local photon injectors are used, ones of said photon injectors fixed in position with respect to corresponding columns and having line of sight on a desired irradiation area within the corresponding writing area.

In some embodiments, non-local photon detectors are used, ones of said photon detectors fixed in position with respect to corresponding individual ones of the columns and having line of sight on a desired photon collection area within the corresponding writing area.

In some embodiments, a local photon injector focuses emitted photons on an area within the main-field deflection area.

In some embodiments, a local photon injector focuses emitted photons on an area larger than the main-field deflection area; in some embodiments, a local photon injector does so for advance preparation of adjacent frames.

In some embodiments, a local photon detector is arranged to collect reflected IR photons to perform process monitoring, where said IR photons were also used to increase the temperature of the substrate.

In some embodiments, other or additional analyses are performed on collected photons than those listed hereinabove.

In some embodiments, other or additional properties of substrate surface material are determined using analysis of detected photons than those listed hereinabove.

In some embodiments, photon injectors shine photons with one or more wavelengths between infrared and deep UV on the main-field deflection area.

In some embodiments, one or more local photon injectors are not paired with corresponding photon detectors, such that reflected light from the unpaired photon injectors will generally not be detected. In some embodiments, one or more local photon detectors are not paired with corresponding photon injectors, such that the unpaired photon detectors will primarily detect emitted (from the substrate surface), rather than reflected light.

A person of ordinary skill in the arts of charged particle beam substrate ALE and/or ALD will recognize that a variety of optical lens materials and shapes, and optical connections between light sources and optical lenses, can be used for photon injectors and detectors; and that a variety of light sources can be used for photon injectors.

In some photon injector embodiments, a light source and an optical lens are directly connected. In some photon detector embodiments, an optical lens and a sensor are directly connected. One of ordinary skill in the arts of charged particle beam ALE and/or ALD will understand that various types of connection between light source and optical lens, between sensor and optical lens, between gas injector outflow and gas source, and between gas detector inflow and mass spectrometer can be used.

In some embodiments, such as when a "shadowing" effect is anticipated such that one or more photon or gas injectors will not have line-of-sight on a target beam impact location during (at least one period of) a direct ALE or ALD process, two or more photon or gas injectors (respectively, spaced at, e.g., 90 or 180 degree increments) can be used so that when a photon or gas injector is "shadowed", one or more of the other photon or gas injectors will have line of sight on the target beam impact location.

In some embodiments, direct ALE and/or ALD as disclosed herein can be used in combination with other substrate processing procedures (e.g., optical lithography and/or charged particle beam lithography) that use resist and/or photomasks to produce semiconductor and other substrate devices.

In some embodiments, charged particle beam columns can use electrostatic focus mechanisms; in some embodiments, charged particle beam columns can use magnetic focus mechanisms.

Additional general background, which helps to show variations and implementations, may be found in the following publications, all of which are hereby incorporated by reference: T. Faraz, "Atomic Layer Etching: What can we learn from Atomic Layer Deposition?", ECS J. Solid State Sci. Technol. 4(6) (2015), N5023-N5032; Riika Puurunen, "Surface chemistry of atomic layer deposition: a case study for the trimethylaluminum/water process", J. App. Phys. 97 (2005):12, 121301-52; Steven M. George, "Atomic Layer Deposition: An Overview", Chem. Rev. (2010), 110(1), 111-31; U.S. Pat. No. 6,355,994; U.S. Pat. No. 6,617,587; U.S. Pat. No. 6,734,428; U.S. Pat. No. 6,738,506; U.S. Pat. No. 6,777,675; U.S. Pat. No. 6,844,550; U.S. Pat. No. 6,872,958; U.S. Pat. No. 6,943,351; U.S. Pat. No. 6,977,375; U.S. Pat. No. 7,122,795; U.S. Pat. No. 7,227,142; U.S. Pat. No. 7,435,956; U.S. Pat. No. 7,456,402; U.S. Pat. No. 7,462,848; U.S. Pat. No. 7,786,454; U.S. Pat. No. 7,928,404; U.S. Pat. No. 7,941,237; U.S. Pat. No. 8,242,457; U.S. Pat. No. 8,384,048; U.S. Pat. No. 8,999,627; U.S. Pat. No. 8,999,628; and U.S. Pat. No. 9,184,027.

Additional general background, which helps to show variations and implementations, as well as some features which can be implemented synergistically with the inventions claimed below, may be found in the following US patent applications. All of these applications have at least some common ownership, copendency, and inventorship with the present application, and all of them, as well as any material directly or indirectly incorporated within them, are hereby incorporated by reference: U.S. patent application Ser. No. 14/085,768; U.S. patent application Ser. No. 14/703,306; U.S. patent application Ser. No. 14/607,821; U.S. patent application Ser. No. 14/522,563; U.S. patent application Ser. No. 14/523,909; U.S. patent application Ser. No. 14/694,710; U.S. patent application Ser. No. 14/695,767; U.S. patent application Ser. No. 14/695,776; U.S. patent application Ser. No. 14/695,785; U.S. patent application Ser. No. 14/745,463; and U.S. patent application Ser. No. 14/809,985.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

The claims as filed are intended to be as comprehensive as possible, and NO subject matter is intentionally relinquished, dedicated, or abandoned.

What is claimed is:

1. A method for targeted atomic layer etching of material from a substrate using multiple charged particle beam columns, individual columns projecting individual charged particle beams at the substrate, comprising the actions of:
   a) injecting at least one gas, using multiple local gas injectors, onto multiple different frames corresponding to multiple different ones of the beams, said gas selected to be adsorbed by and lower a dissociation energy of an exterior layer of the substrate surface; and
   b) scanning said frames using said corresponding beams, selected locations in said frames being targeted by said beams in dependence on the design layout database, wherein a beam energy of said corresponding beams is selected to increase the rate of dissociation from the substrate body only of said selected locations of said layer that adsorbed said gas;
   wherein steps a) and b) are performed serially;
   wherein each of said frames is a portion of the substrate to which a corresponding one of the beams can be deflected at a particular time, such that each of the beams corresponds to a single frame; and
   wherein said injecting and said scanning are performed differently, independently and simultaneously by different ones of said columns and said local gas injectors, such that parameters controlling said injecting and said scanning by ones of said columns and said local as injectors are not dependent on parameters controlling said injecting and said scanning by others of said columns and said local gas injectors.

2. The method of claim 1, wherein steps a) and b) are iteratively repeated to thereby etch said material at said targeted locations to a selected number of layers.

3. The method of claim 2, wherein different numbers of said iterations are performed for different ones of said targeted locations.

4. The method of claim 2, further comprising collecting photons emitted or reflected from said frames using local photon detectors; analyzing said collected photons; and at least one of:
   determining endpoints for said etching in at least partial dependence on said analyzing, wherein said scanning and/or said injecting are performed in at least partial dependence on said determining; and
   automatically modifying parameters controlling said scanning and/or said injecting and/or said determining in at least partial dependence on said analyzing.

5. The method of claim 1, wherein said gas is selected so that said adsorption does not etch said layer and said adsorption comprises at least one of dissociative adsorption, ligand exchange and associative chemisorption.

6. The method of claim 1, wherein said corresponding beams are targeted in direct dependence on the design layout database.

7. The method of claim 1, further comprising determining a beam scanning cycle endpoint using a local gas detector to detect said surface material dissociated in step b).

8. The method of claim 1, further comprising injecting photons onto multiple ones of said frames using local photon injectors, said photons having a wavelength selected to, within corresponding ones of said frames, do at least one of:
   raising the temperature of the substrate surface material;
   exciting electrons of said substrate surface material; and
   reflecting photons off said corresponding frame to be collected by a local photon detector.

9. The method of claim 1, further comprising injecting photons onto multiple ones of said frames using local photon injectors, said photons having a wavelength selected to, within corresponding ones of said frames, cause desorption of one or more of adsorbed: said gas, byproducts of said adsorption or said dissociation, impurities in said gas, gasses injected by gas injectors local to non-corresponding columns, and ambient gasses in the vacuum chamber.

10. The method of claim 1, wherein said beams are electrostatically deflected by said columns.

11. The method of claim 1, wherein said targeted locations are selected to comprise one or more Hadamard targets configured to be used as one or more of: anti-tamper devices, security codes, watermarks, anti-counterfeiting codes, identification data, or addressing data.

12. The method of claim 1, wherein a particular one of said local gas injectors injects a gas having a different chemical composition than a gas injected by another of said local gas injectors, said particular local gas injector being local to a different one of said columns than said another local as injector.

13. The method of claim 1, further comprising at least one of the columns writing or imaging the substrate and not performing said steps a) and b), while others of the columns perform said steps a) and b).

14. The method of claim 1, wherein none of a photomask, resist layer or hard mask are used to perform said etching or to pattern substrate portions etched by said etching.

15. The method of claim 1, wherein said substrate surface comprises substrate material or a material deposited on the substrate.

* * * * *